United States Patent
Tashiro et al.

(10) Patent No.: US 10,868,056 B2
(45) Date of Patent: Dec. 15, 2020

(54) SOLID-STATE IMAGING ELEMENT AND ELECTRONIC APPARATUS

(71) Applicant: SONY SEMICONDUCTOR SOLUTIONS CORPORATION, Kanagawa (JP)

(72) Inventors: Yoshiaki Tashiro, Tokyo (JP); Satoko Iida, Kanagawa (JP); Yorito Sakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/466,244

(22) PCT Filed: Nov. 30, 2017

(86) PCT No.: PCT/JP2017/043159
§ 371 (c)(1),
(2) Date: Jun. 3, 2019

(87) PCT Pub. No.: WO2018/110303
PCT Pub. Date: Jun. 21, 2018

(65) Prior Publication Data
US 2020/0066773 A1 Feb. 27, 2020

(30) Foreign Application Priority Data
Dec. 14, 2016 (JP) ................. 2016-242145

(51) Int. Cl.
*H01L 27/146* (2006.01)
*H04N 5/355* (2011.01)
*H04N 5/374* (2011.01)

(52) U.S. Cl.
CPC ....... *H01L 27/14612* (2013.01); *H04N 5/355* (2013.01); *H04N 5/374* (2013.01)

(58) Field of Classification Search
None
See application file for complete search history.

(56) References Cited

U.S. PATENT DOCUMENTS

2008/0237446 A1* 10/2008 Oshikubo ........... H01L 27/1463
250/208.1
2010/0208115 A1* 8/2010 Sugawa ............. H04N 5/37452
348/308

(Continued)

FOREIGN PATENT DOCUMENTS

JP 2004-282554 10/2004
JP 2009-130679 6/2009

(Continued)

OTHER PUBLICATIONS

Extended European Search Report for European Patent Application No. 17880688.1, dated Feb. 17, 2020, 10 pages.

(Continued)

*Primary Examiner* — James M Hannett
(74) *Attorney, Agent, or Firm* — Sheridan Ross P.C.

(57) ABSTRACT

The present disclosure relates to a solid-state imaging element and an electronic apparatus which are capable of utilizing almost all photoelectrically converted charges for signals during high capacitance. A pixel includes a selection transistor that is disposed on a drain side of an amplification transistor and selects a read-out row, the selection transistor selects the read-out row after reset by a reset transistor, and a transfer transistor performs reference potential read-out during high capacitance prior to reference potential read-out during low capacitance. For example, the present disclosure is applicable to a lamination-type solid-state imaging element.

20 Claims, 18 Drawing Sheets

(56) References Cited

U.S. PATENT DOCUMENTS

| | | | | |
|---|---|---|---|---|
| 2014/0327802 A1* | 11/2014 | Mabuchi | ............. | H04N 5/3559 |
| | | | | 348/308 |
| 2017/0094202 A1* | 3/2017 | Kobayashi | ........ | H01L 27/14612 |
| 2018/0054576 A1* | 2/2018 | Otaka | .................... | H04N 5/379 |

FOREIGN PATENT DOCUMENTS

| | | |
|---|---|---|
| JP | 2009-302978 | 12/2009 |
| JP | 2012-119349 | 6/2012 |
| WO | WO 2013/111629 | 8/2013 |

OTHER PUBLICATIONS

International Search Report prepared by the Japan Patent Office on Feb. 6, 2018, for International Application No. PCT/JP2017/043159.

* cited by examiner

SOLID-STATE IMAGING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2017/043159 having an international filing date of 30 Nov. 2017, which designated the United States, which PCT application claimed the benefit of Japanese Patent Application No. 2016-242145 filed 14 Dec. 2016, the entire disclosures of each of which are incorporated herein by reference.

TECHNICAL FIELD

The present disclosure relates to a solid-state imaging element and an electronic apparatus, and more particularly, to a solid-state imaging element and an electronic apparatus which are capable of utilizing almost all photoelectrically converted charges for signals during high capacitance.

BACKGROUND ART

In the related art, with regard to a four-transistor type pixel circuit, there is known a sensor in which a connection transistor and a capacitor are added to a floating diffusion (FD), and read-out is performed twice by switching a charge-voltage conversion gain, thereby enlarging a dynamic range (for example, Patent Document 1).

In a typical CMOS image sensor (CIS), electrons generated in a photodiode (PD) are subjected to charge-voltage conversion in a single FD. The capacitance of the FD at this time has a relationship with a charge-voltage gain (CG) and the number of saturation charges (Qs), and these parameters have a trade-off relationship. For example, in a case where capacitance is set to be small, a voltage that is generated per one electron increases, and thus the CG becomes high. However, since a large voltage is generated in a small number of electrons, and thus capacitance is likely to be satisfied, and the Qs decreases. In a case where the capacitance is set to be large, the opposite case occurs. The trade-off relationship limits a dynamic range of the CIS.

Patent Document 1 solves the trade-off by
  switching a capacitor of the FD with a transistor switch and an added capacitor, and
  by performing a read-out operation twice.

The CG is set to be high by setting the FD to be very small. In accordance with this, the Qs decreases in the FD, but it is possible to make the Qs large by increasing capacitance through connection with a capacitor. When the read-out operation is performed in each state, signals during low capacitance are used in a low-illuminance region, and signals during high capacitance are used in a high-illuminance region, the trade-off is resolved, and thus it is possible to enlarge the dynamic range. Particularly, high sensitivity of a low-illuminance state is advantageous.

CITATION LIST

Patent Document

Patent Document 1: Japanese Patent Application Laid-Open No. 2012-119349

SUMMARY OF THE INVENTION

Problems to be Solved by the Invention

However, in the read-out operation in Patent Document 1, an effect of sufficiently enlarging the dynamic range is not obtained. Since charges which are read-out in a small-capacitance mode are used in a reference potential (or is reset) during high capacitance, this does not contribute to signal charges in a large-capacitance mode (loss of signal charges occurs).

The present disclosure has been made in consideration of such circumstances, and an object thereof is to utilize almost all photoelectrically converted charges for signals during high capacitance.

Solutions to Problems

A solid-state imaging element according a first aspect of the present technology includes a pixel region in which a plurality of pixels are arranged. Each of the plurality of pixels includes a photoelectric conversion unit, a transfer transistor, a plurality of floating diffusion units which receive charges from the photoelectric conversion unit through the transfer transistor, a reset transistor that resets the plurality of floating diffusion units, a separation transistor that performs ON/OFF control of connection of the plurality of floating diffusion units, an amplification transistor that outputs a signal corresponding to a potential of each of the plurality of floating diffusion units, and a selection transistor that is disposed on a drain side of the amplification transistor and selects a read-out row, the selection transistor selects the read-out row after reset by the reset transistor, and the transfer transistor performs reference potential read-out during high capacitance prior to reference potential read-out during low capacitance.

A power supply on a drain side of the reset transistor may have a configuration capable of performing potential control of the plurality of floating diffusion units, and the reset transistor may reset the plurality of floating diffusion unit to a low potential after a read-out operation.

An electronic apparatus according to the first aspect of the present technology includes a solid-state imaging element that includes a pixel region in which a plurality of pixels are arranged, each of the plurality of pixels including a photoelectric conversion unit, a transfer transistor, a plurality of floating diffusion units which receive charges from the photoelectric conversion unit through the transfer transistor, a reset transistor that resets the plurality of floating diffusion units, a separation transistor that performs ON/OFF control of connection of the plurality of floating diffusion units, an amplification transistor that outputs a signal corresponding to a potential of each of the plurality of floating diffusion units, and a selection transistor that is disposed on a drain side of the amplification transistor and selects a read-out row, the selection transistor selecting the read-out row after reset by the reset transistor, and the transfer transistor performing reference potential read-out during high capacitance prior to reference potential read-out during low capacitance; a signal processing circuit that processes an output signal that is output from the solid-state imaging element; and an optical system that causes incident light to be incident to the solid-state imaging element.

A solid-state imaging element according to a second aspect of the present technology includes a pixel region in which a plurality of pixels are arranged. Each of the plurality of pixels includes a photoelectric conversion unit, a transfer transistor, a plurality of floating diffusion units which receive charges from the photoelectric conversion unit through the transfer transistor, a reset transistor that resets the plurality of floating diffusion units, a separation transistor that performs ON/OFF control of connection of the plurality of floating diffusion units, and an amplification transistor that outputs a signal corresponding to a potential of each of the plurality of floating diffusion units. A power supply on a drain side of the reset transistor has a configuration capable of performing potential control of the plurality of floating diffusion units, ON/OFF switching of the amplification transistor is performed by the potential control of the plurality of floating diffusion units, the transfer transistor performs reference potential read-out during high capacitance prior to reference potential read-out during low capacitance, and the reset transistor resets the plurality of floating diffusion unit to a low potential after a read-out operation.

An electronic apparatus according to the second aspect of the present technology includes a solid-state imaging element that includes a pixel region in which a plurality of pixels are arranged, each of the plurality of pixels including a photoelectric conversion unit, a transfer transistor, a plurality of floating diffusion units which receive charges from the photoelectric conversion unit through the transfer transistor, a reset transistor that resets the plurality of floating diffusion units, a separation transistor that performs ON/OFF control of connection of the plurality of floating diffusion units, and an amplification transistor that outputs a signal corresponding to a potential of each of the plurality of floating diffusion units, a power supply on a drain side of the reset transistor having a configuration capable of performing potential control of the plurality of floating diffusion units, ON/OFF switching of the amplification transistor being performed by the potential control of the plurality of floating diffusion units, the transfer transistor performing reference potential read-out during high capacitance prior to reference potential read-out during low capacitance, and the reset transistor resetting the plurality of floating diffusion unit to a low potential after a read-out operation; a signal processing circuit that processes an output signal that is output from the solid-state imaging element; and an optical system that causes incident light to be incident to the solid-state imaging element.

A solid-state imaging element according to a third aspect of the present technology includes a pixel region in which a plurality of pixels are arranged. Each of the plurality of pixels includes a photoelectric conversion unit, a transfer transistor, a plurality of floating diffusion units which receive charges from the photoelectric conversion unit through the transfer transistor, a reset transistor that resets the plurality of floating diffusion units, a separation transistor that performs ON/OFF control of connection of the plurality of floating diffusion units, and an amplification transistor that outputs a signal corresponding to a potential of each of the plurality of floating diffusion units. Before reference potential read-out during low capacitance, a gate of the separation transistor is turned on in a state in which a drain side is in a floating state, and the transfer transistor performs reference potential read-out during high capacitance.

After the reference potential read-out during high capacitance, the gate of the separation transistor may be turned off in a state in which the drain side is in a floating state, and the transfer transistor may perform reference potential read-out during low capacitance.

A negative bias of the separation transistor when being turned off is adjusted.

A threshold value of the separation transistor may be adjusted.

A node that is parasitic in the plurality of floating diffusion unit is used, and a potential of the plurality of floating diffusion unit when the separation transistor is turned on may be lowered.

The solid-state imaging element may further include a selection transistor that is disposed on a source side of the amplification transistor and selects a read-out row.

The solid-state imaging element may further include a selection transistor that is disposed on a drain side of the amplification transistor and selects a read-out row.

A power supply on a drain side of the reset transistor may have a configuration capable of performing potential control of the plurality of floating diffusion units, and ON/OFF switching of the amplification transistor may be performed by the potential control of the plurality of floating diffusion units.

An electronic apparatus according to the third aspect of the present technology includes a solid-state imaging element that includes a pixel region in which a plurality of pixels are arranged, each of the plurality of pixels including a photoelectric conversion unit, a transfer transistor, a plurality of floating diffusion units which receive charges from the photoelectric conversion unit through the transfer transistor, a reset transistor that resets the plurality of floating diffusion units, a separation transistor that performs ON/OFF control of connection of the plurality of floating diffusion units, and an amplification transistor that outputs a signal corresponding to a potential of each of the plurality of floating diffusion units, and before reference potential read-out during low capacitance, a gate of the separation transistor being turned on in a state in which a drain side is in a floating state, and the transfer transistor performing reference potential read-out during high capacitance; a signal processing circuit that processes an output signal that is output from the solid-state imaging element; and an optical system that causes incident light to be incident to the solid-state imaging element.

In the first aspect of the present technology, after reset of the plurality of floating diffusion units by the reset transistor, a read-out row is selected by the selection transistor that is provided on a drain side of the amplification transistor that outputs signals corresponding to potentials of the plurality of floating diffusion units which receive charges from the photoelectric conversion unit through the transfer transistor, and reference potential read-out during high capacitance is performed by the transfer transistor prior to reference potential read-out during low capacitance.

In the second aspect of the present technology, after reset by the reset transistor, a read-out row is selected by the selection transistor that is provided on a drain side of the amplification transistor that outputs signals corresponding to potentials of the plurality of floating diffusion units which receive charges from the photoelectric conversion unit through the transfer transistor, and reference potential read-out during high capacitance is performed by the transfer transistor prior to reference potential read-out during low capacitance.

In the third aspect of the present technology, prior to reference potential read-out during low capacitance, a gate is turned on in a state in which a drain side is in a floating state by the separation transistor that performs ON/OFF control of connection of the plurality of floating diffusion units which receive charges from the photoelectric conversion unit through the transfer transistor, and reference potential read-out during high capacitance is performed by the transfer transistor.

Effects of the Invention

According to the present technology, it is possible to utilize almost all photoelectrically converted charges for signals during high capacitance.

Furthermore, an effect described in this specification is illustrative only, and the effect of the present technology is not limited to the effect described in this specification, and an additional effect may be present.

MODE FOR CARRYING OUT THE INVENTION

Hereinafter, a mode for carrying out the present disclosure (hereinafter, referred to as "embodiment") will be described. Furthermore, description will be made in the following order.

0. Schematic Configuration Example of Solid-State Imaging Element
   1. First Embodiment
   2. Second Embodiment
   3. Third Embodiment
   4. Fourth Embodiment
   5. Fifth Embodiment
   6. Sixth Embodiment
   7. Disposition Example of Solid-State Imaging Element
   8. Use Example of Image Sensor
   9. Example of Electronic Apparatus
   10. Application Example to Endoscopic Operating System
   11. Application Example to Moving Body 0. Schematic Configuration Example of Solid-State Imaging Element FIG. 1 illustrates a schematic configuration example of an example of a complementary metal oxide semiconductor (CMOS) solid-state imaging element that is applied to respective embodiments of the present technology.

Figure 1:
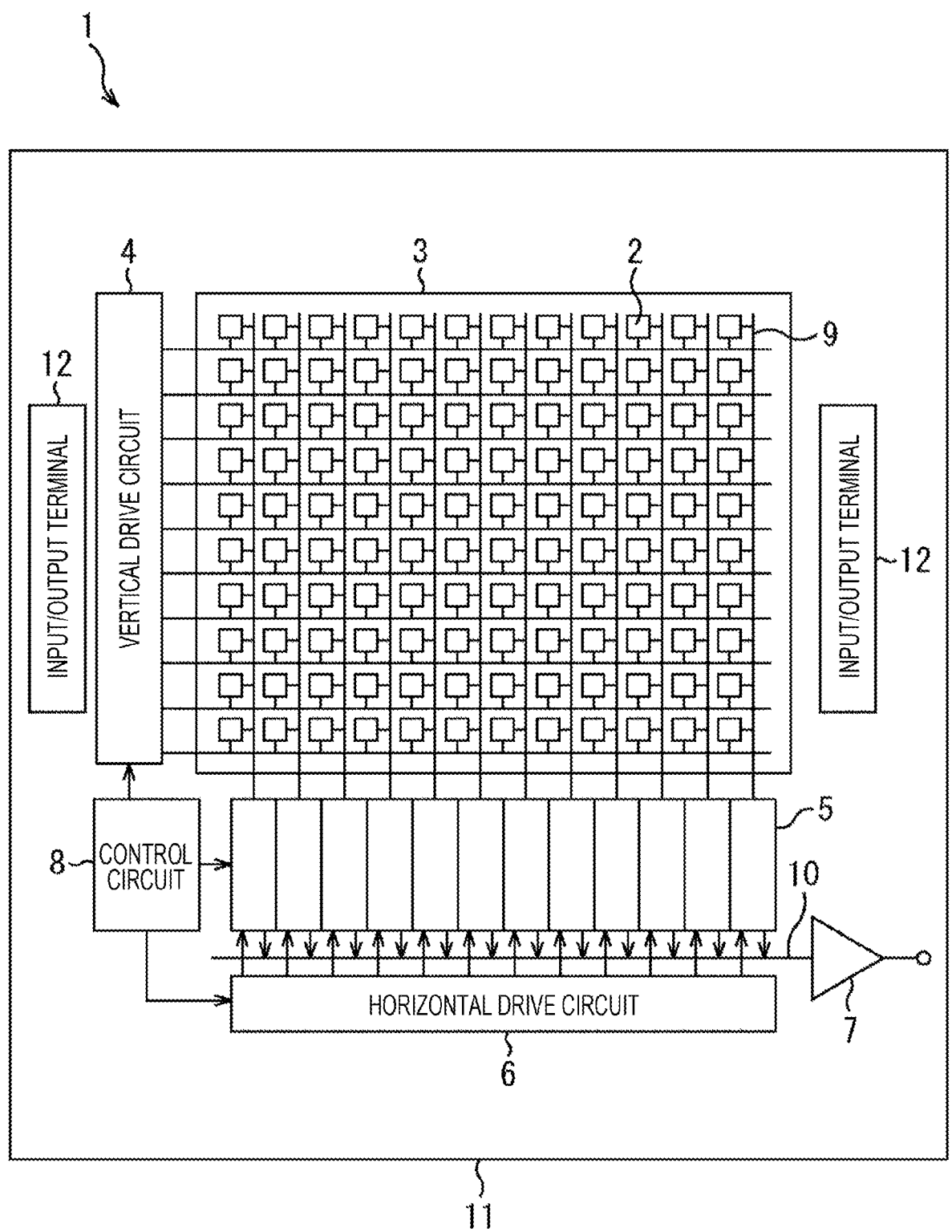
FIG. 1 is a block diagram illustrating a schematic configuration example of a solid-state imaging element to which the present technology is applied.

As illustrated in FIG. 1, a solid-state imaging element (element chip) 1 includes a pixel region (a so-called imaging region) 3 in which pixels 2 including a plurality of photoelectric conversion elements are regularly and two-dimensionally arranged on a semiconductor substrate 11 (for example, a silicon substrate), and a peripheral circuit region.

Each of the pixels 2 includes a photoelectric conversion element (for example, a photo diode (PD)), and a plurality of pixel transistors (so-called MOS transistors). For example, the plurality of pixel transistors can be constituted by three transistors including a transfer transistor, a reset transistor, and an amplification transistor, or can be constituted by four transistors by further adding a selection transistor.

In addition, the pixel 2 can be set to a pixel sharing structure. The pixel sharing structure includes a plurality of photodiodes, a plurality of transfer transistors, a floating diffusion that is shared, and another pixel transistor that is shared. The photodiode is a photoelectric conversion element.

The peripheral circuit region includes a vertical drive circuit 4, a column signal processing circuit 5, a horizontal drive circuit 6, an output circuit 7, and a control circuit 8.

The control circuit 8 receives an input clock, data that gives an instruction for an operation mode, and the like, and outputs data such as internal information of the solid-state imaging element 1. Specifically, the control circuit 8 generates a clock signal or a control signal which becomes a reference of an operation of the vertical drive circuit 4, the column signal processing circuit 5, and the horizontal drive circuit 6 on the basis of a vertical synchronization signal, a horizontal synchronization signal, and a master clock. In addition, the control circuit 8 inputs the signals to the vertical drive circuit 4, the column signal processing circuit 5, and the horizontal drive circuit 6.

For example, the vertical drive circuit 4 is constituted by a shift register, selects a pixel drive interconnection, supplies a pulse for driving the pixel 2 to the pixel drive interconnection that is selected, and drives the pixel 2 in a row unit. Specifically, the vertical drive circuit 4 selectively scans the pixels 2 in the pixel region 3 in a row unit sequentially in a vertical direction, and supplies pixel signal based on a signal charge generated in correspondence with a light reception amount in the photoelectric conversion element of each of the pixels 2 to the column signal processing circuit 5 through a vertical signal line (VSL) 9.

For example, the column signal processing circuit 5 is disposed for every column of the pixels 2, and performs signal processing such as noise removal for every pixel column with respect to signals output from the pixels 2 corresponding to one row. Specifically, the column signal processing circuit 5 performs correlated double sampling (CDS) for removing fixed pattern noise that is specific to the pixel 2, and signal processing such as signal amplification, and analog/digital (A/D) conversion. A horizontal selection switch (not illustrated) is provided between an output stage of the column signal processing circuit 5 and a horizontal signal line 10 to be connected to the output stage.

For example, the horizontal drive circuit 6 is constituted by a shift register, sequentially outputs a horizontal scanning pulse to sequentially select each of the column signal processing circuits 5, and outputs a pixel signal from each of the column signal processing circuits 5 to the horizontal signal line 10.

The output circuit 7 performs signal processing with respect to signals which are sequentially supplied from the column signal processing circuits 5 through the horizontal signal line 10, and outputs the resultant signals. For example, the output circuit 7 may perform only buffering, or may perform black level adjustment, column variation correction, various kinds of digital signal processing, and the like.

An input/output terminal 12 is provided to perform signal exchange with an outer side.

1. First Embodiment

Configuration Example of Solid-State Imaging Element

An embodiment of the solid-state imaging element according to the present technology includes a pixel region in which a plurality of pixels are arranged in a two-dimensional matrix shape, and each of the plurality of pixels includes the following elements. The pixel includes an accumulation unit that detects a physical amount and accumulates a charge corresponding to the physical amount, that is, a photodiode PD that becomes a photoelectric conversion unit, and a transfer transistor that transfers a charge from the photodiode PD. In addition, the pixel includes a plurality of detection units which receives the charge from the photodiode PD through the transfer transistor, that is, a plurality of floating diffusion units FD, and a reset transistor that resets the floating diffusion units FD. In addition, the pixel includes a separation transistor that performs ON/OFF control of connection between the plurality of floating diffusion units FD, and an amplification transistor that outputs a signal corresponding to a potential of the floating diffusion unit FD.

Figure 2:
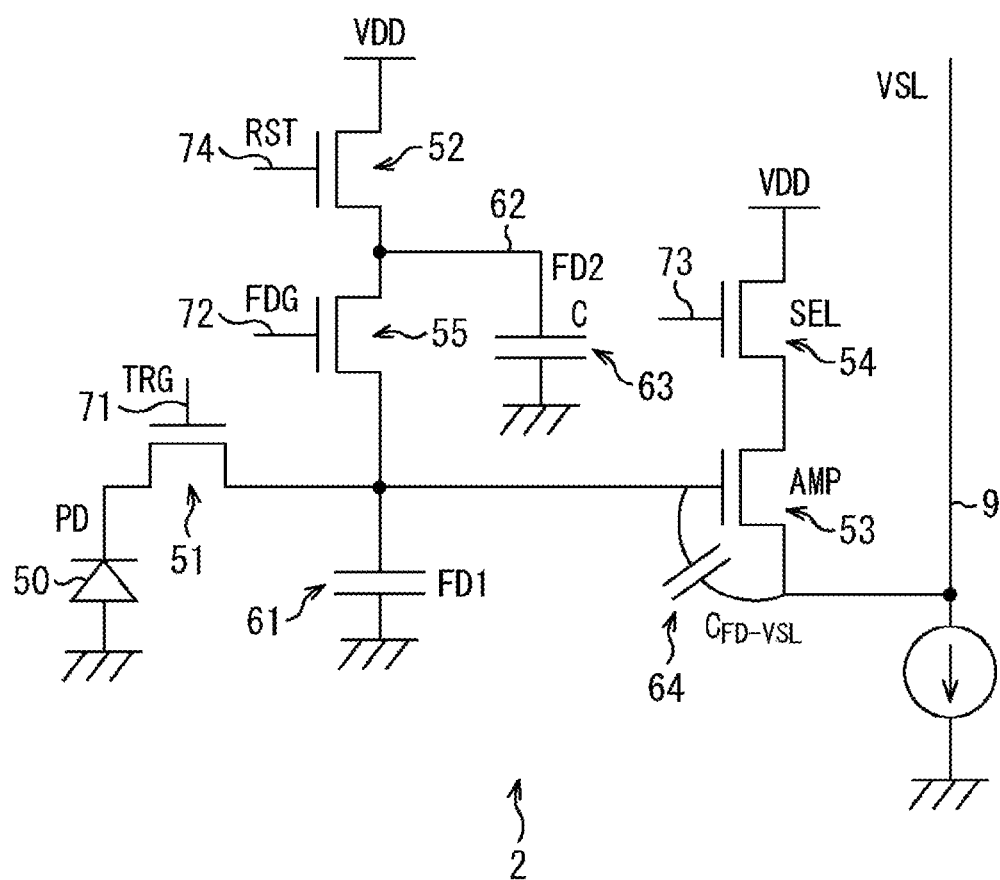
FIG. 2 is a diagram illustrating an equivalent circuit of a pixel of the solid-state imaging element according to a first embodiment.

FIG. 2 is a diagram illustrating an equivalent circuit of the pixel of the solid-state imaging element according to the first embodiment. In this embodiment, the equivalent circuit includes two floating diffusion units FD1 and FD2. The pixel 2 includes a photodiode (PD) 50, a transfer transistor (TRG) 51, a reset transistor (RST) 52, an amplification transistor (AMP) 53, a selection transistor (SEL) 54, a separation transistor (FDG) 55, a first floating diffusion unit (FD1) 61, and a second floating diffusion unit (FD2) 62. In the example illustrated in FIG. 2, the selection transistor 54 is disposed on a drain side of the amplification transistor 53.

The photodiode 50 is connected to the first floating diffusion unit 61 through the transfer transistor 51. The first floating diffusion unit 61 is connected to a gate of the amplification transistor 53 and is connected to the second floating diffusion unit 62 through the separation transistor 55. The second floating diffusion unit 62 is connected to the reset transistor 52, and is connected to a capacitive element (C) 63. The other end of the capacitive element 63 is grounded. In this example, the second floating diffusion unit 62 receives not only parasitic capacitance but also total capacitance by the capacitive element 63. For example, the capacitive element 63 can be formed from polysilicon or the like, and in another example, only parasitic capacitance of a diffusion layer may be used without providing the capacitive element 63 in the open. As an example, the capacitive element 63 may be constituted in a structure of a polysilicon film-gate oxide film-Si substrate, or in a structure of first-layer polysilicon film-interlayer film such as SiN-second-layer polysilicon film. The drain of the amplification transistor 53 is connected to the selection transistor 54, and a source thereof is connected to the vertical signal line 9. Furthermore, in FIG. 2, for example, as a parasitic node of the FD, an FD boost 64 is shown between the drain and the source, but the parasitic node of the FD that is used in the present technology is not limited to the FD boost 64. In addition, drains of the reset transistor 52 and the selection transistor 54 are connected to a power supply Vdd.

To preferably perform read-out of high capacitance and low capacitance, it is preferable that the second floating diffusion unit 62 has capacitance that is two times to 20 times capacitance of the first floating diffusion unit 61. In addition, it is preferable the capacitance of the second floating diffusion unit 62 is set to a certain extent capable of accurately receiving a saturation charge of the photodiode 50.

A gate of the transfer transistor 51 is connected to a transfer line 71. A gate of the separation transistor 55 is connected to a separation line 72. A gate of the selection transistor 54 is connected to a selection line 73. A gate of the reset transistor 52 is connected to a reset line 74.

In the pixel 2, when the selection transistor 54 is in an ON-state, the amplification transistor 53 outputs a signal corresponding to a potential of the first floating diffusion unit 61 to the vertical signal line (VSL) 9. In addition, in a state in which the separation transistor 55 is turned on, the amplification transistor 53 outputs a signal corresponding to a potential of the first and second floating diffusion units 61 and 62, which are connected, to the vertical signal line (VSL) 9. The vertical signal line (VSL) 9 is connected to a column processing circuit that is a rear stage circuit as described above, and the signal output to the vertical signal line 9 is fetched to the column processing circuit. The reset transistor 52 discharges the charge of the first and second floating diffusion units 61 and 62 to the power supply Vdd, that is, a power supply interconnection to reset the first and second floating diffusion units 61 and 62.

[Drive Method]

Figure 3:
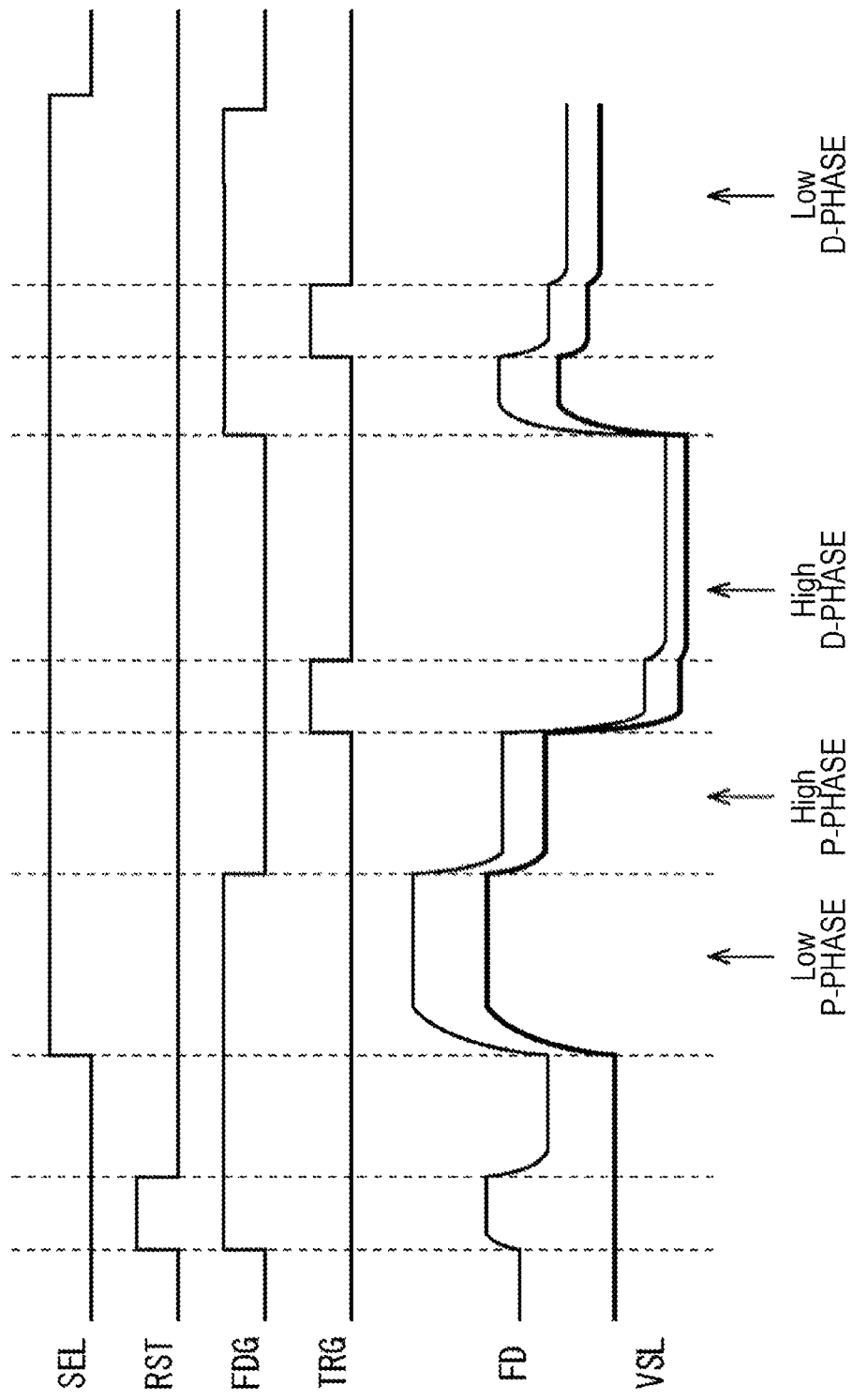
FIG. 3 is a diagram illustrating a drive method of the solid-state imaging element illustrated in FIG. 2.

The solid-state imaging element of the first embodiment is configured to be driven by a drive method illustrated in FIG. 3. In an example illustrated in FIG. 3, SEL represents a drive timing of the selection transistor 54, RST represents a drive timing of the reset transistor 52, FDG represents a drive timing of the separation transistor 55, and TRG represents a drive timing of the transfer transistor 51. FD represents a potential fluctuation of the first and second floating diffusion units 61 and 62, and VSL represents a potential fluctuation of the vertical signal line 9.

First, when initiating a read-out operation, the reset transistor 52 and the separation transistor 55 enter an ON-state, and thus reset of the FD (hereinafter, the first and second floating diffusion units 61 and 62 are collectively referred to as "FD") is performed. After the reset transistor 52 enters an OFF-state, in a state in which the separation transistor 55 is in the ON-state as is, a row selection operation by the selection transistor 54 is performed, and thus a potential fluctuation of the vertical signal line (VSL) 9 is transferred to the FD, and thus it is possible to make the potential of the FD be a high potential.

Then, reference potential read-out during high capacitance (low P-phase) is performed, and then the separation transistor 55 enters an OFF-state, and thus reference read-out during low capacitance (high P-phase) is performed.

When the transfer transistor 51 enters an ON-state, a charge of the photodiode 50 is transferred to the first floating diffusion unit 61, and when the transfer transistor 51 enters an OFF-state, data read-out during low capacitance (high D-phase) is performed. Then, the transfer transistor 51 enters an ON-state in a state in which the separation transistor 55 is in an ON-state, and when the transfer transistor 51 enters an OFF-state, data read-out during high capacitance (low D-phase) is performed. After data read-out, the selection transistor 54 and the separation transistor 55 are turned off.

Here, for example, in the case of a drive method in which a charge that is read-out during low capacitance is used in a reference potential during high capacitance (or is reset), loss of a signal charge occurs, and thus the lost signal charge does not contribute to a signal charge during large capacitance. In contrast, in the drive method illustrated in FIG. 3, the reference potential read-out during high capacitance (low P-phase) is set to be performed prior to reference read-out during low capacitance (high P-phase).

With this arrangement, all charges accumulated in the photodiode 50 contribute to the signal charge, and thus it is possible to utilize the advantage of enlargement of the dynamic range to the maximum.

In addition, for example, in the case of a drive method in which the row selection operation by the selection transistor 54 and the reset operation of the FD are simultaneously performed, a potential fluctuation of the vertical signal line (VSL) 9 which occurs during row selection is less likely to be transferred to the FD (that is, the FD is fixed to a reset voltage).

In contrast, in the drive method illustrated in FIG. 3, after the reset operation by the reset transistor 52, the row selection operation by the selection transistor 54 is performed. Accordingly, the potential fluctuation of the vertical signal line (VSL) 9 is transferred to the FD (the first and second floating diffusion units 61 and 62), and it is possible to make the potential of the floating diffusion be a high potential.

With this arrangement, it is possible to cancel an influence in which the first and second floating diffusion units 61 and 62 become a low potential due to charge injection, and it is possible to avoid interruption of transfer.

However, in the drive method illustrated in FIG. 3, gate capacitance of the amplification transistor 53 is added to the vertical signal line (VSL) 9 as is, and thus it is difficult to prevent an increase in a load of the vertical signal line (VSL) 9.

2. Second Embodiment

Configuration Example of Solid-State Imaging Element

Figure 4:
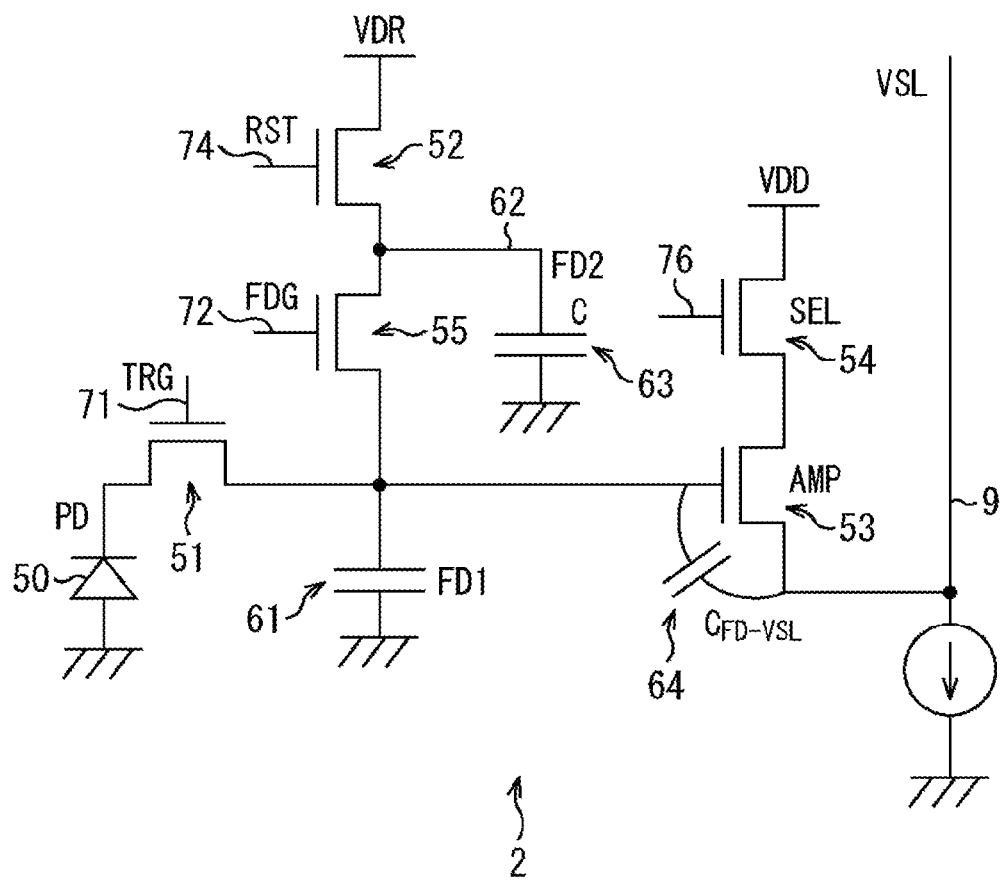
FIG. 4 is a diagram illustrating an equivalent circuit of a pixel of a solid-state imaging element according to a second embodiment.

FIG. 4 is a diagram illustrating an equivalent circuit of a pixel of a solid-state imaging element according to a second embodiment.

A circuit configuration of a pixel 2 in FIG. 4 is basically the same as the circuit configuration of the pixel 2 illustrated in FIG. 2. That is, the pixel 2 in FIG. 4 includes the photodiode (PD) 50, the transfer transistor (TRG) 51, the reset transistor (RST) 52, the amplification transistor (AMP) 53, the selection transistor (SEL) 55, the separation transistor (FDG) 55, the first floating diffusion unit (FD1) 61, and the second floating diffusion unit (FD2) 62, and this configuration is common to the pixel 2 in FIG. 2. However, the circuit configuration of the pixel 2 in FIG. 4 is different from the circuit configuration of the pixel 2 in FIG. 2 in that the common power supply VDD on a drain side of the reset transistor 53 is substituted with an independent VDR. In addition, the independent power supply VDR for reset can take two values including a high potential and a low potential. That is, the independent power supply VDR for reset is configured to realize potential control of the FD.

[Drive Method]

Figure 5:
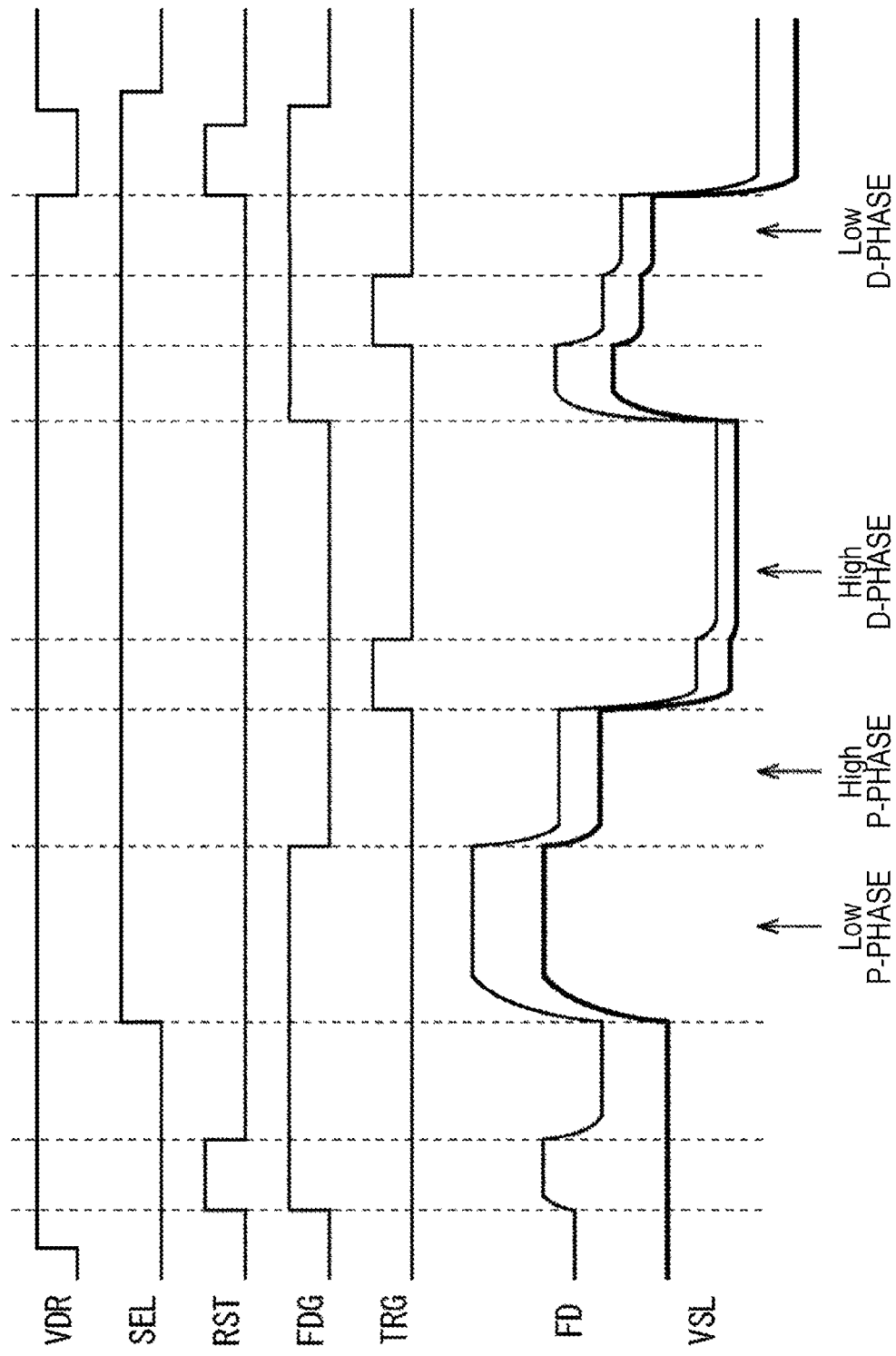
FIG. 5 is a diagram illustrating a drive method of the solid-state imaging element illustrated in FIG. 4.

The solid-state imaging element of the second embodiment is configured to be driven by a drive method illustrated in FIG. 5. In an example illustrated in FIG. 5, VDR represents a drive timing of the independent power supply VDR for reset. SEL represents a drive timing of the selection transistor 54, RST represents a drive timing of the reset transistor 52, FDG represents a drive timing of the separation transistor 55, and TRG represents a drive timing of the transfer transistor 51. FD represents a potential fluctuation of the first and second floating diffusion units 61 and 62, and VSL represents a potential fluctuation of the vertical signal line 9.

In the drive method illustrated in FIG. 5, drive of the VDR, and reset of FD (the first and second floating diffusion units 61 and 62) after read-out are added.

Specifically, first, when initiating a read-out operation, reset of the FD is performed. At this time, the VDR is in a high-potential state, and the FD is reset to a high potential. As described later, at a final stage of the read-out operation of a previous frame, the FD is reset to a low potential by a low potential of the VDR, and the amplification transistor 53 is in an OFF-state. According to this, a reset operation at a high potential also has an effect of setting the amplification transistor 53 to an ON-state in addition to execution of reset of the FD.

Then, in a similar manner as in the drive method in FIG. 3, a read-out operation is sequentially performed. After read-out of the selection transistor 54 is terminated, the VDR is set to a low-potential state, and reset of the FD is performed. The amplification transistor 53 enters an OFF-state, and thus capacitance of a gate of the amplification transistor 53 is prevented from being superimposed on the vertical signal line (VSL) 9 during a read-out period of another row, and it is possible to reduce a load of the vertical signal line (VSL) 9.

Here, in the case of the circuit configurations in FIG. 2 and FIG. 4, the selection transistor 54 is connected to the drain side of the amplification transistor 53. Accordingly, in the drive method illustrated in FIG. 3, the gate capacitance of the amplification transistor 53 is superimposed on the load of the vertical signal line (VSL) 9, and thus time is taken for settling (potential holding) of the vertical signal line (VSL) 9. As a result, a frame rate is limited.

In contrast, when using the drive method illustrated in FIG. 5, ON/OFF of the amplification transistor 53 can be switched, the load of the vertical signal line (VSL) 9 is reduced, and it is possible to resolve limitation of the frame rate.

3. Third Embodiment

Configuration Example of Solid-State Imaging Apparatus

Figure 6:
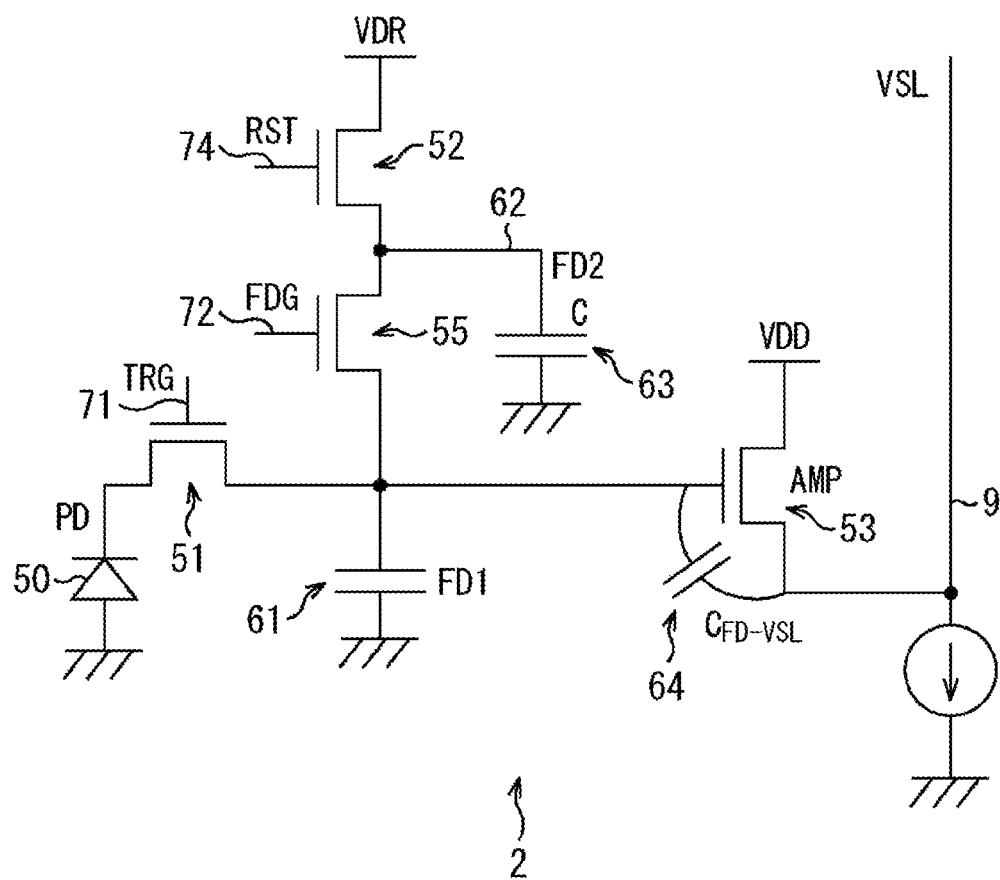
FIG. 6 is a diagram illustrating an equivalent circuit of a pixel of a solid-state imaging element according to a third embodiment.

FIG. 6 is a diagram illustrating an equivalent circuit of a pixel of a solid-state imaging apparatus according to a third embodiment.

A circuit configuration of a pixel 2 illustrated in FIG. 6 is different from the circuit configuration in FIG. 4 in that the selection transistor 54 is excluded. The pixel 2 in FIG. 6 includes the photodiode (PD) 50, the transfer transistor (TRG) 51, the reset transistor (RST) 52, the amplification transistor (AMP) 53, the separation transistor (FDG) 55, the first floating diffusion unit (FD1) 61, and the second floating diffusion unit (FD2) 62, and this configuration is common to the circuit configuration in FIG. 4.

[Drive Method]

Figure 7:
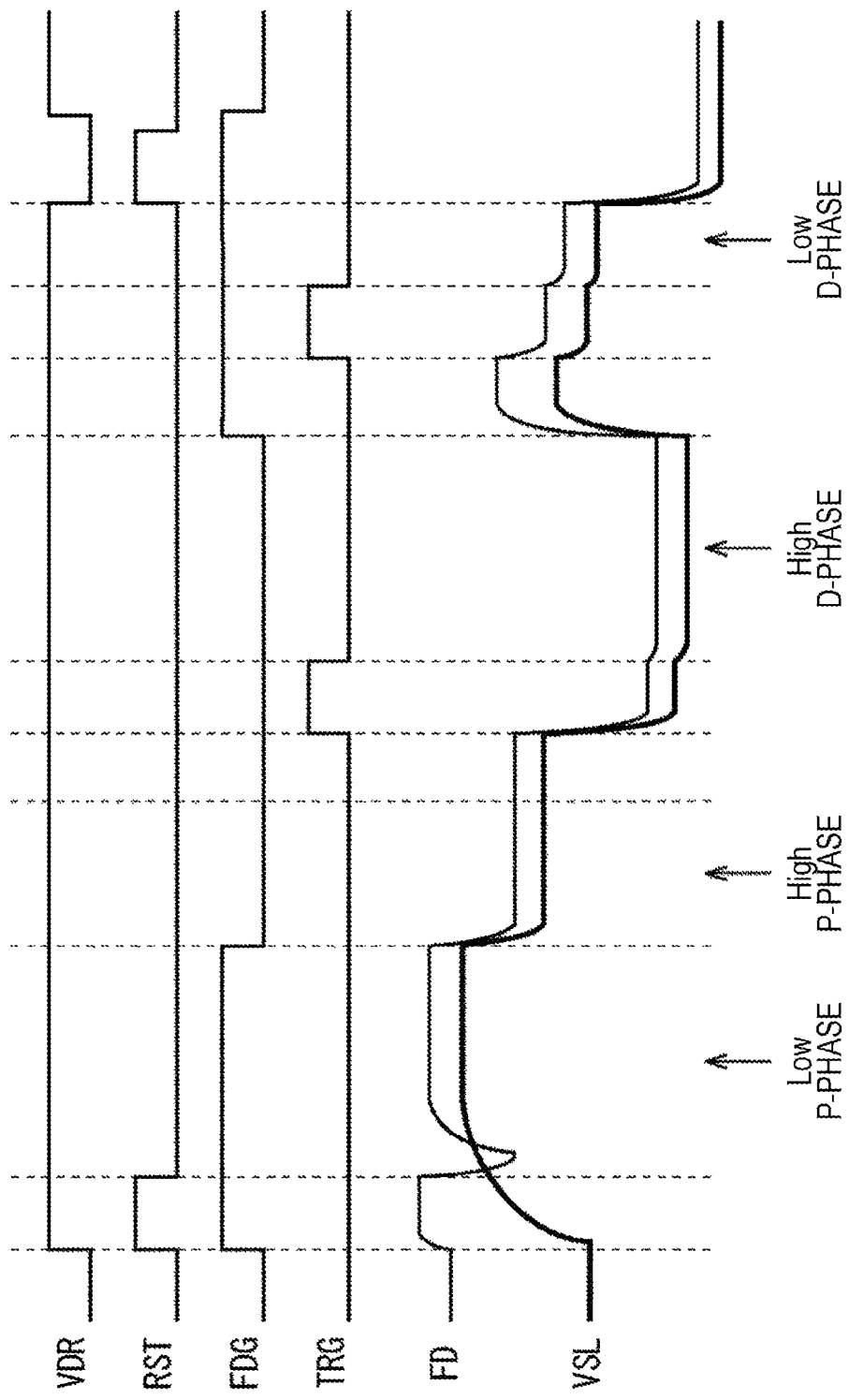
FIG. 7 is a diagram illustrating a drive method of the solid-state imaging element illustrated in FIG. 6.

The solid-state imaging device of the third embodiment is configured to be driven by a drive method illustrated in FIG. 7. In an example illustrated in FIG. 7, VDR represents a drive timing of the independent power supply VDR for reset. RST represents a drive timing of the reset transistor 52, FDG represents a drive timing of the separation transistor 55, and TRG represents a drive timing of the transfer transistor 51. FD represents a potential fluctuation of the first and second floating diffusion units 61 and 62, and VSL represents a potential fluctuation of the vertical signal line 9.

The drive method illustrated in FIG. 7 is the same as the drive method illustrated in FIG. 5 except that drive of the selection transistor 54 is excluded. That is, when initiating a read-out operation, reset of the FD is performed. At this time, the VDR is in a high-potential state, and the FD is reset to a high potential. As described later, at a final stage of the read-out operation of a previous frame, the FD is reset to a low potential by a low potential of the VDR, and the amplification transistor 53 is in an OFF-state. According to this, a reset operation at a high potential also has an effect of setting the amplification transistor 53 to an ON-state in addition to execution of reset of the FD.

Then, in a similar manner as in the drive method in FIG. 3, a read-out operation is sequentially performed. After read-out is terminated, the VDR is set to a low-potential state, and reset of the FD is performed. The amplification transistor 53 enters an OFF-state, and thus capacitance of the gate of the amplification transistor 53 is prevented from being superimposed on the vertical signal line (VSL) 9 during a read-out period of another row, and it is possible to reduce a load of the vertical signal line (VSL) 9.

As described above, in the third embodiment, it is possible to perform row selection by switching ON and OFF of the amplification transistor 53 through control of the FD potential, and as a result, the selection transistor 54 can be excluded.

On the other hand, in the third embodiment, it is necessary to give attention to a high potential of the FD potential which is obtained by using the potential fluctuation of the vertical signal line (VSL) 9 that is an effect in the first and second embodiments. That is, at a timing of resetting the FD to a high potential at an initial stage of the read-out operation, row selection is also initiated, and thus potential fluctuation of the vertical signal line (VSL) 9 is also initiated. It is necessary that the FD reset is terminated early than correction of the potential fluctuation, and the potential fluctuation the vertical signal line (VSL) 9 is transferred to the FD. Accordingly, with regard to an ON-period of the reset transistor 52, it is necessary to secure a sufficient period for the reset operation, and it is necessary to shorten the ON-period as much as possible.

As described above, according to the present technology, it is possible to utilize almost all charges which are photo-electrically converted by the photodiode for signals during high capacitance, and high sensitivity due to low capacitance of the FD and an effect of an increase in Qs due to connection capacitor are obtained to the maximum, and this can contribute to enlargement of the dynamic range.

In addition, according to the present technology, since the FD potential is set to a high potential by using the potential fluctuation of the vertical signal line, and thus the FD is suppressed from being a low potential immediately after reset, and linearity in a low-illuminance region can be secured.

In addition, according to the present technology, the gate capacitance of the amplification transistor of each row by the low-potential reset of the FD is prevented from being superimposed on the vertical signal line, and the load of the vertical signal line is reduced, and this contributes to an improvement of the frame rate.

4. Fourth Embodiment

Configuration Example of Solid-State Imaging Element

Figure 8:
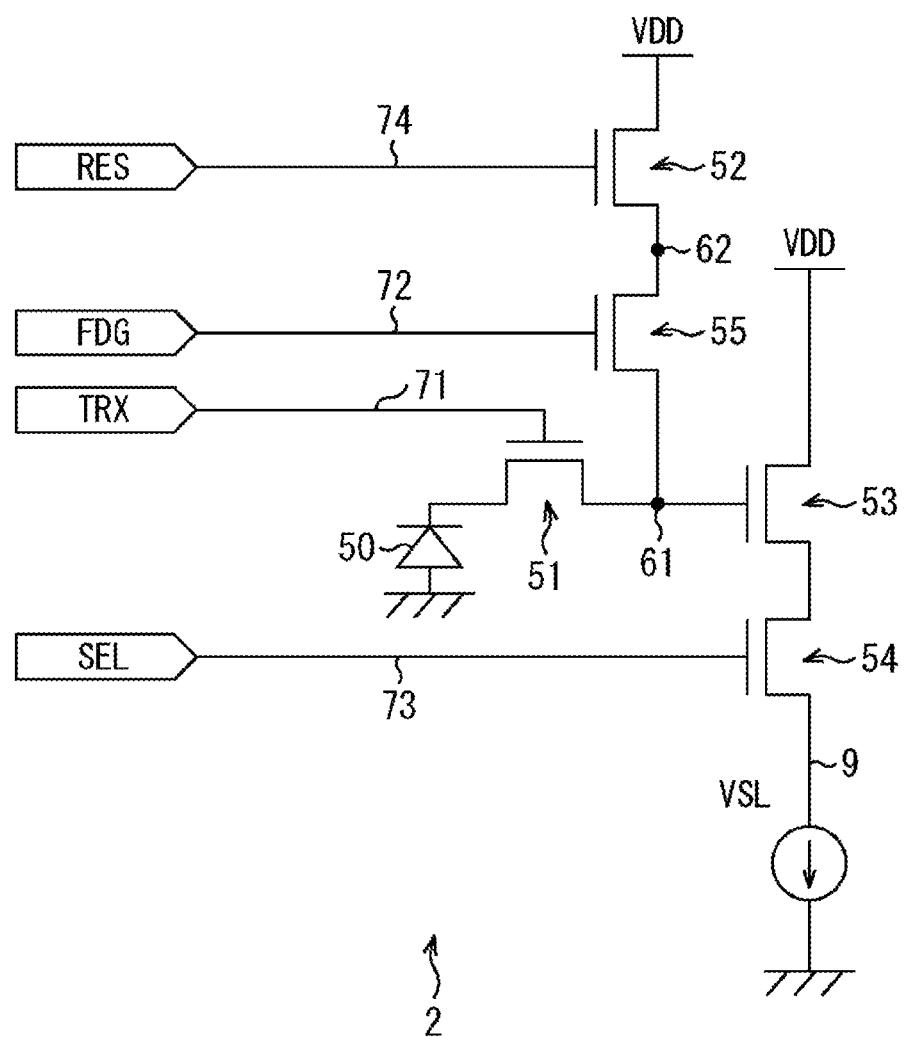
FIG. 8 is a diagram illustrating an equivalent circuit of a pixel of a solid-state imaging element according to a fourth embodiment.

FIG. 8 is a diagram illustrating an equivalent circuit of a pixel of a solid-state imaging element according to a fourth embodiment.

A circuit configuration of the pixel 2 in FIG. 8 is different from the circuit configuration of the pixel 2 in FIG. 2 in that the selection transistor 54 and the amplification transistor 53 are disposed at opposite positions. The pixel 2 in FIG. 8 includes the photodiode 50, the transfer transistor 51, the reset transistor 52, the amplification transistor 53, the selection transistor 54, the separation transistor 55, the first floating diffusion unit 61, and the second floating diffusion unit 62, and this configuration is common to the pixel 2 in FIG. 2. In addition, in a similar manner as in the circuit configuration in FIG. 2, a gate of the transfer transistor 51 is connected to transfer line (TRX) 71. A gate of the separation transistor 55 is connected to a separation (FDG) line 72. A gate of the selection transistor 54 is connected to a selection (SEL) line 73. A gate of the reset transistor 52 is connected to a reset (RES) line 74.

[Drive Method]

Figure 9:
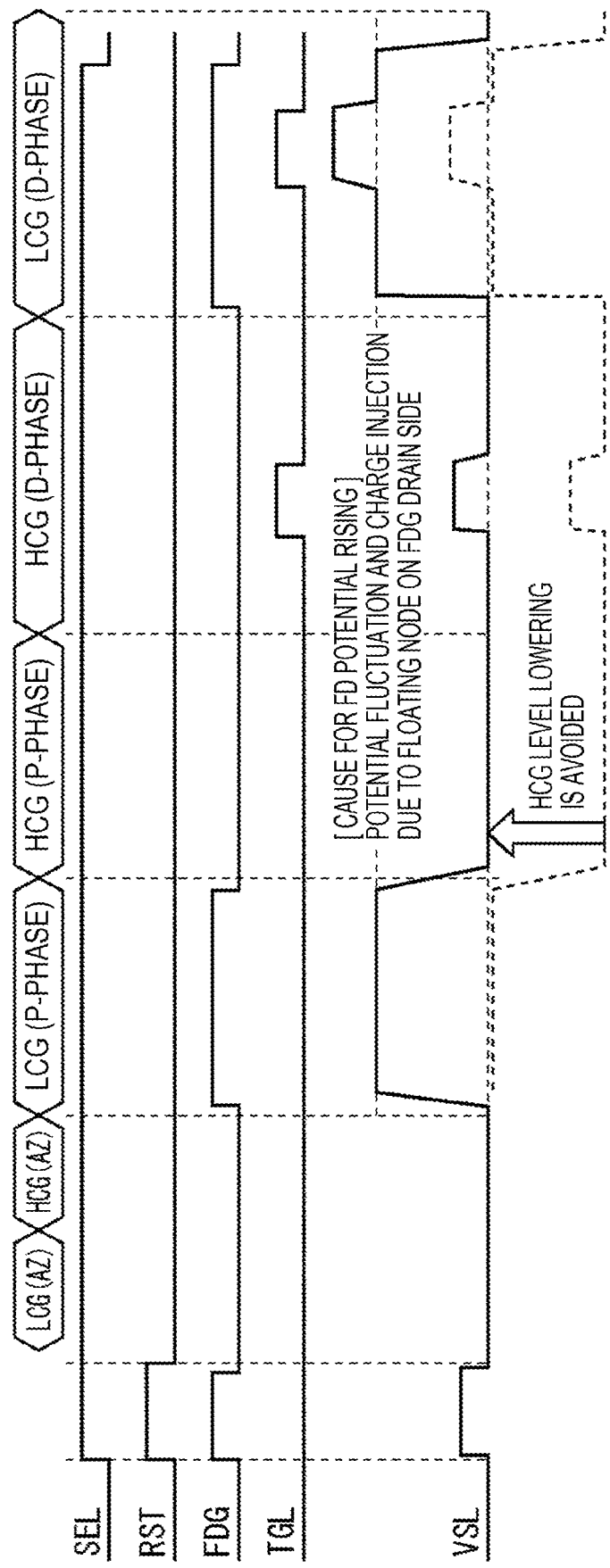
FIG. 9 is a diagram illustrating a drive method of the solid-state imaging element illustrated in FIG. 8.

The solid-state imaging device of the fourth embodiment is configured to be driven by a drive method illustrated in FIG. 9. In an example illustrated in FIG. 9, SEL represents a drive timing of the selection transistor 54, RST represents a drive timing of the reset transistor 52, FDG represents a drive timing of the separation transistor 55, and TRL (TRX) represents a drive timing of the transfer transistor 51. In addition, VSL represents a potential fluctuation of the vertical signal line 9. Furthermore, a dotted line in VSL represents VSL, for example, in the case of the drive method described in Patent Document 1 for comparison with VSL (solid line) in the case of the drive method of the present technology.

First, when initiating a read-out operation, the selection transistor 54 is turned on by the selection line 73, and the separation transistor 55 and the reset transistor 52 are simultaneously turned on by the separation line 72 and the reset line 74. According to this, the potential of the FD (the first floating diffusion unit 61 and the second floating diffusion unit 62) is reset. Then, after the separation transistor 55 is turned off, when the reset transistor 52 is turned off, this state is set as a reference potential of a comparator, and auto zero (AZ during high capacitance and low capacitance) is performed.

In a state in which the reset transistor 52 in an OFF-state, when the separation transistor 55 is turned on, parasitic capacitance between the separation transistor 55 and the FD and charges of the FD are induced to a channel of the separation transistor 55, and thus the FD potential is raised. In this state, reference potential read-out during high capacitance (low P-phase) is performed, and the separation transistor 55 enters an OFF-state.

According to this, the parasitic capacitance between the separation transistor 55 and the FD, and the charges of the FD are injected to the FD (charge injection), and thus the FD potential is lowered. In this state, reference potential read-out during low capacitance (high P-phase) is performed.

At this time, the FD potential is raised at the low P-phase, and shows similar lowering as in the low P-phase at the high P-phase, and thus an increase or a decrease of the FD potential becomes approximately zero, and lowering of the FD potential is avoided.

Continuously, the gate of the transfer transistor 51 enters an ON-state, and thus charges of the photodiode 50 are read out, and signal potential read-out during low capacitance (high D-phase) is performed. In addition, the separation transistor 55 enters an ON-state, and thus the gate of the transfer transistor 51 is turned on again. Accordingly, all PD charges can be read out, and this leads to signal potential read-out during high capacitance (low D-phase).

However, it is difficult to control a charge injection amount by turning ON/OFF the separation transistor 55 in a state in which the reset transistor 52 is in an OFF state, and it is also difficult to control rising and lowering of the FD potential in combination.

Here, when performing drive in the fourth embodiment, a potential fluctuation before and after ON/OFF of the separation transistor 55 becomes zero, and the FD potential lowering does not occur. However, in a case where rising of the FD potential is excessively great due to the ON-state of the separation transistor 55, the FD potential lowering may occur. The reason for this is because it is difficult to detect the original low P-phase potential i separation from a D range of a comparator, or even in a case where a voltage is raised to a pixel power supply voltage or greater, it is difficult to detect the original low P-phase potential.

Modification Example

Furthermore, although the circuit configuration or the drive of the fourth embodiment is not changed, as a first modification example, a negative bias of the separation transistor 55 when being turned off may be adjusted to control the charge injection amount.

In addition, although the circuit configuration or the drive of the fourth embodiment is not changed, as a second modification example, a threshold value Vth of the separation transistor 55 is turned off may be adjusted to control the charge injection amount.

In addition, in the circuit configuration of the fourth embodiment, the FD potential when the separation transistor 55 is turned on is lowered by using the parasitic node in the FD (for example, the FD boost 64 in FIG. 2).

5. Fifth Embodiment

Configuration Example of Solid-State Imaging Element

Figure 10:
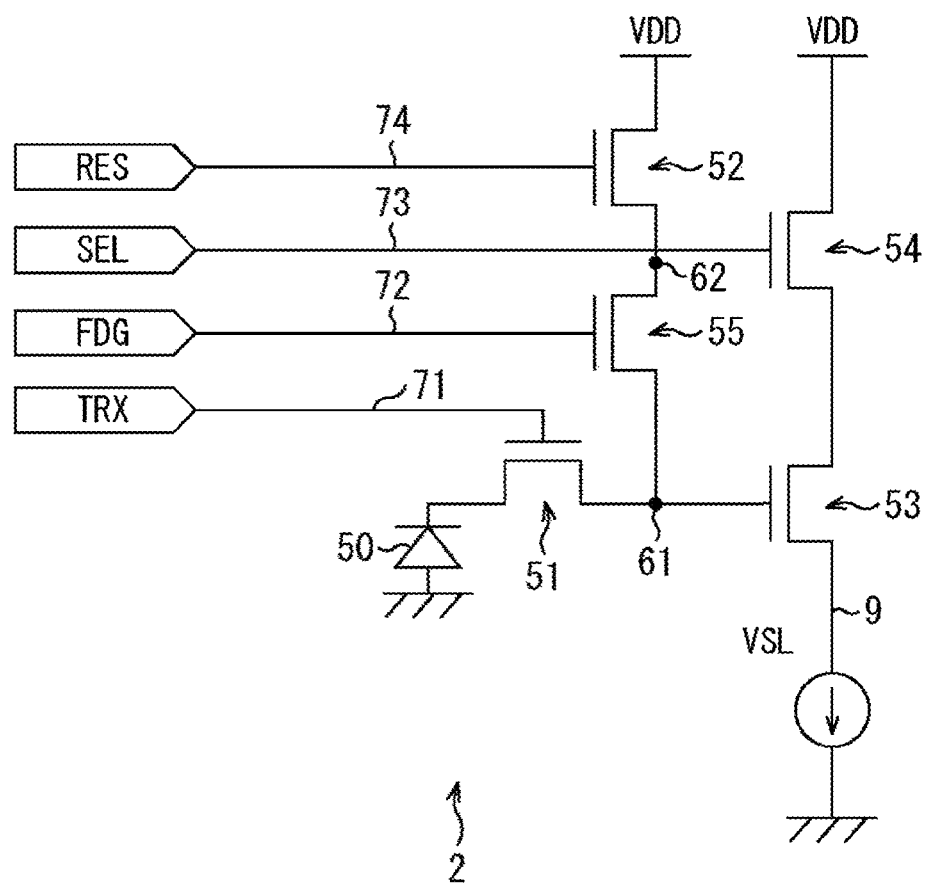
FIG. 10 is a diagram illustrating an equivalent circuit of a pixel of a solid-state imaging element according to a fifth embodiment.

FIG. 10 is a diagram illustrating an equivalent circuit of a pixel of a solid-state imaging element according to a fifth embodiment.

A circuit configuration of a pixel 2 in FIG. 10 is different from the circuit configuration of the pixel 2 in FIG. 8 only in that the selection transistor 54 that is disposed on a source side of the amplification transistor 53 is disposed on a drain side of the amplification transistor. The pixel 2 in FIG. 8 includes the photodiode 50, the transfer transistor 51, the reset transistor 52, the amplification transistor 53, the selection transistor 54, the separation transistor 55, the floating diffusion unit (FD) 61, and the second floating diffusion unit 62, and this configuration is common to the circuit configuration in FIG. 8.

Even in the circuit configuration in which the selection transistor 54 is disposed on the drain side of the amplification transistor 53, the drive method performs basically the same operation as in the drive method in the fourth embodiment described with reference to FIG. 9, and has the same effect. Accordingly, redundant description thereof will be omitted.

6. Sixth Embodiment

Configuration Example of Solid-State Imaging Element

Figure 11:
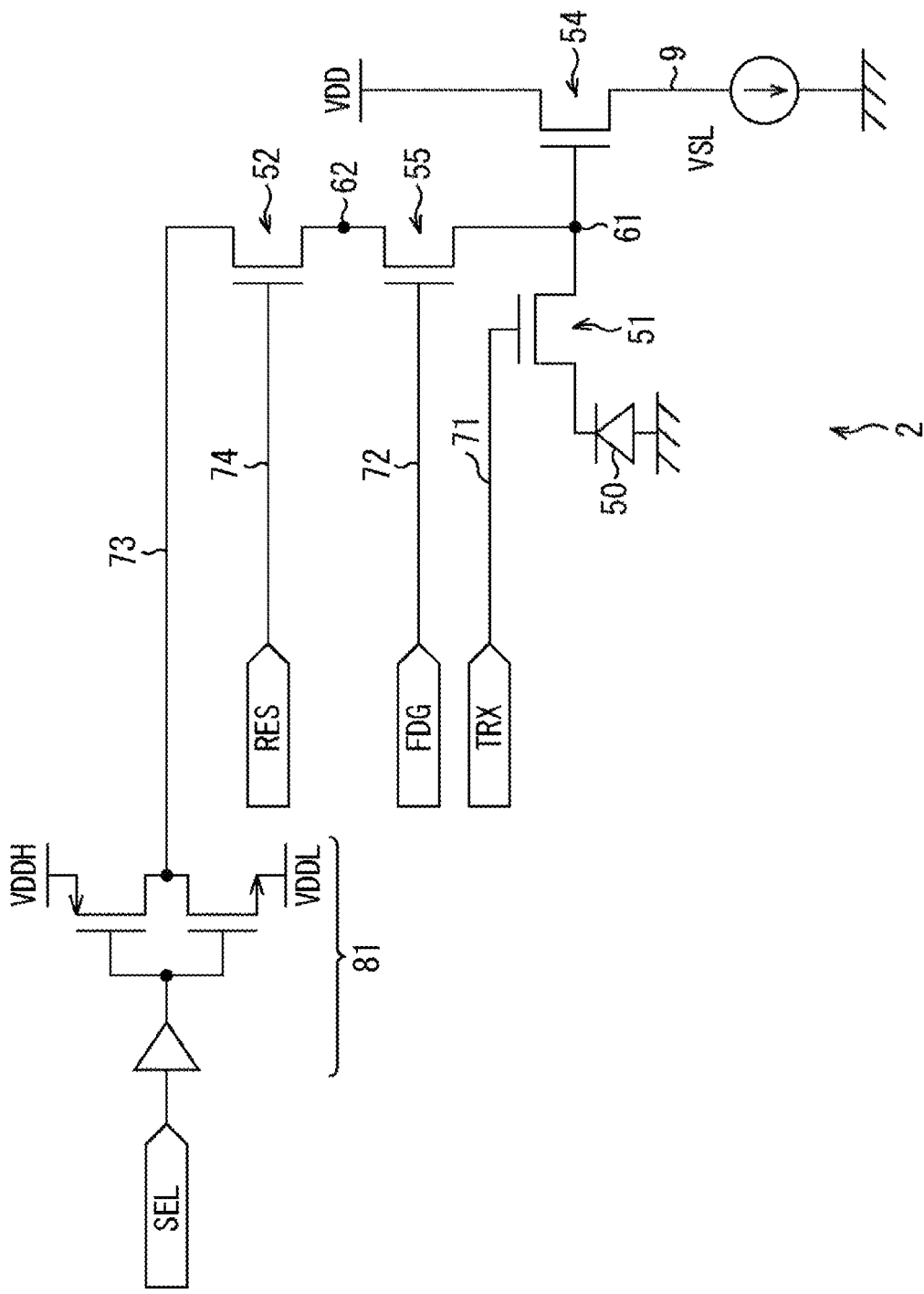
FIG. 11 is a diagram illustrating an equivalent circuit of a pixel of a solid-state imaging element according to a sixth embodiment.

FIG. 11 is a diagram illustrating an equivalent circuit of a pixel of a solid-state imaging element according to a sixth embodiment. In the equivalent circuit in FIG. 11, an example in a case where a selection transistor is excluded and row selection is performed at a reset potential is illustrated.

The circuit configuration of the pixel 2 in FIG. 11 is different from the circuit configuration of the pixel 2 in FIG. 8 only in that the selection transistor 54 is excluded, and selection or non-selection of the power of the reset transistor 52, which is input from a circuit 81 by the selection line 73, is determined when VDDH or VDDL is applied to a circuit 81. For example, VDDH/VDDL is approximately 3.3 V/1.2 V. The pixel 2 in FIG. 8 includes the photodiode (PD) 50, the transfer transistor 51, the reset transistor 52, the amplification transistor 53, the separation transistor 55, the floating diffusion unit 61, and the second floating diffusion unit 62, and this configuration is common to the circuit configuration in FIG. 8.

As illustrated in FIG. 11, even in the circuit configuration in which the selection transistor 54 is excluded, the drive method performs basically the same operation as in the drive method in the fourth embodiment described with reference to FIG. 9, and has the same effect. Accordingly, redundant description thereof will be omitted. That is, even in a case where the selection transistor does not exist, and row selection is performed with the reset potential, in a selected row, a drive timing is the same as the drive timing of SEL in FIG. 9.

As described above, according to the technologies described in the fourth to sixth embodiments, it is possible to utilize almost all charges which are photoelectrically converted by the photodiode for signals during high capacitance, and high sensitivity due to low capacitance of the FD and an effect of an increase in Qs due to connection capacitor are obtained to the maximum, and this can contribute to enlargement of the dynamic range.

In addition, when the order of ON and OFF of the separation transistor is changed, and setting of the FD potential to a high potential is performed, the FD is easily suppressed from being a low potential immediately after reset, and linearity in a low-illuminance region can be secured.

Furthermore, the present technology is applicable to not only the above-described solid-state imaging element but also large and small pixels, pixel sharing, and a solid-state imaging element of lamination type CIS. A circuit configuration in the case of the solid-state imaging element of the lamination type CIS can be arbitrarily disposed in upper and lower chips as illustrated in FIG. 12.

7. Disposition Example of Solid-State Imaging Element

Figure 12:
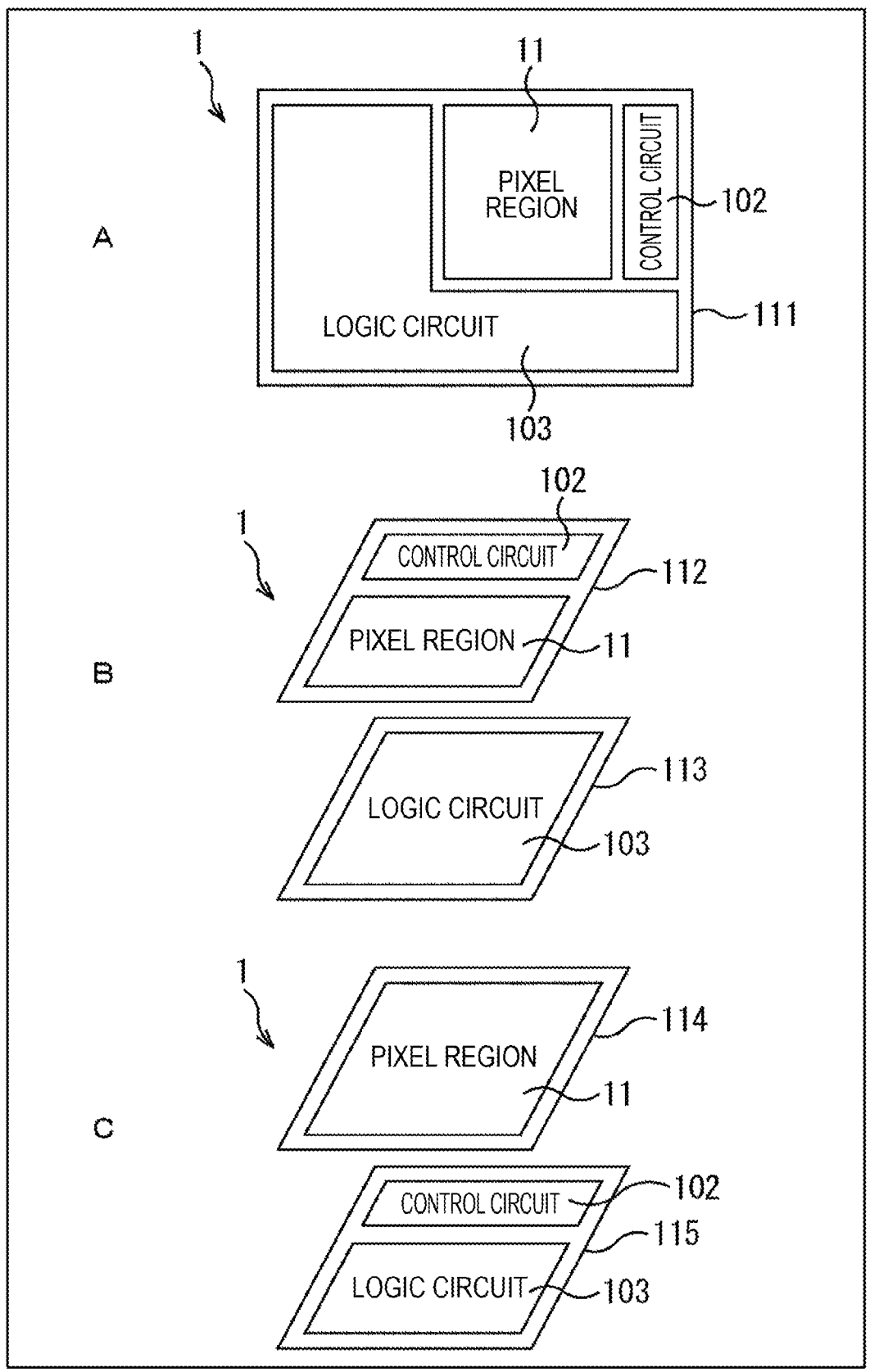
FIG. 12 is a schematic diagram illustrating a configuration example of a solid-state imaging element to which the present technology is applied.

FIG. 12 is a diagram illustrating a disposition example of the solid-state imaging element 1 illustrated in FIG. 1.

For example, disposition of the pixel region 11, a control circuit 102, and a logic circuit 103 including a signal processing circuit of the solid-state imaging element 1 may be set to any one of first disposition to third disposition as illustrated in A of FIG. 12 to C of FIG. 12.

Specifically, as illustrated in A of FIG. 12, disposition of the pixel region 11, the control circuit 102, and the logic circuit 103 of the solid-state imaging element 1 may be set to the first disposition in which all of the components are disposed in one semiconductor substrate 111.

In addition, as illustrated in B of FIG. 12, the disposition of the pixel region 11, the control circuit 102, and the logic circuit 103 of the solid-state imaging element 1 may be set to the second disposition in which the pixel region 11 and the control circuit 102 are disposed on one side between two semiconductor substrates 112 and 113, and the logic circuit 103 is disposed on the other side. In an example in B of FIG. 12, the pixel region 11 and the control circuit 102 are disposed in the semiconductor substrate 112 and the logic circuit 103 is disposed in the semiconductor substrate 113.

In addition, as illustrated in C of FIG. 12, the disposition of the pixel region 11, the control circuit 102, and the logic circuit 103 of the solid-state imaging element 1 may be set to the third disposition in which the pixel region 11 is disposed on one side between two semiconductor substrates 114 and 115 which are laminated, and the control circuit 102 and the logic circuit 103 are disposed on the other side. In an example in C of FIG. 12, the pixel region 11 is disposed in the semiconductor substrate 114, and the control circuit 102 and the logic circuit 103 are disposed in the semiconductor substrate 115.

8. Use Example of Image Sensor

Figure 13:
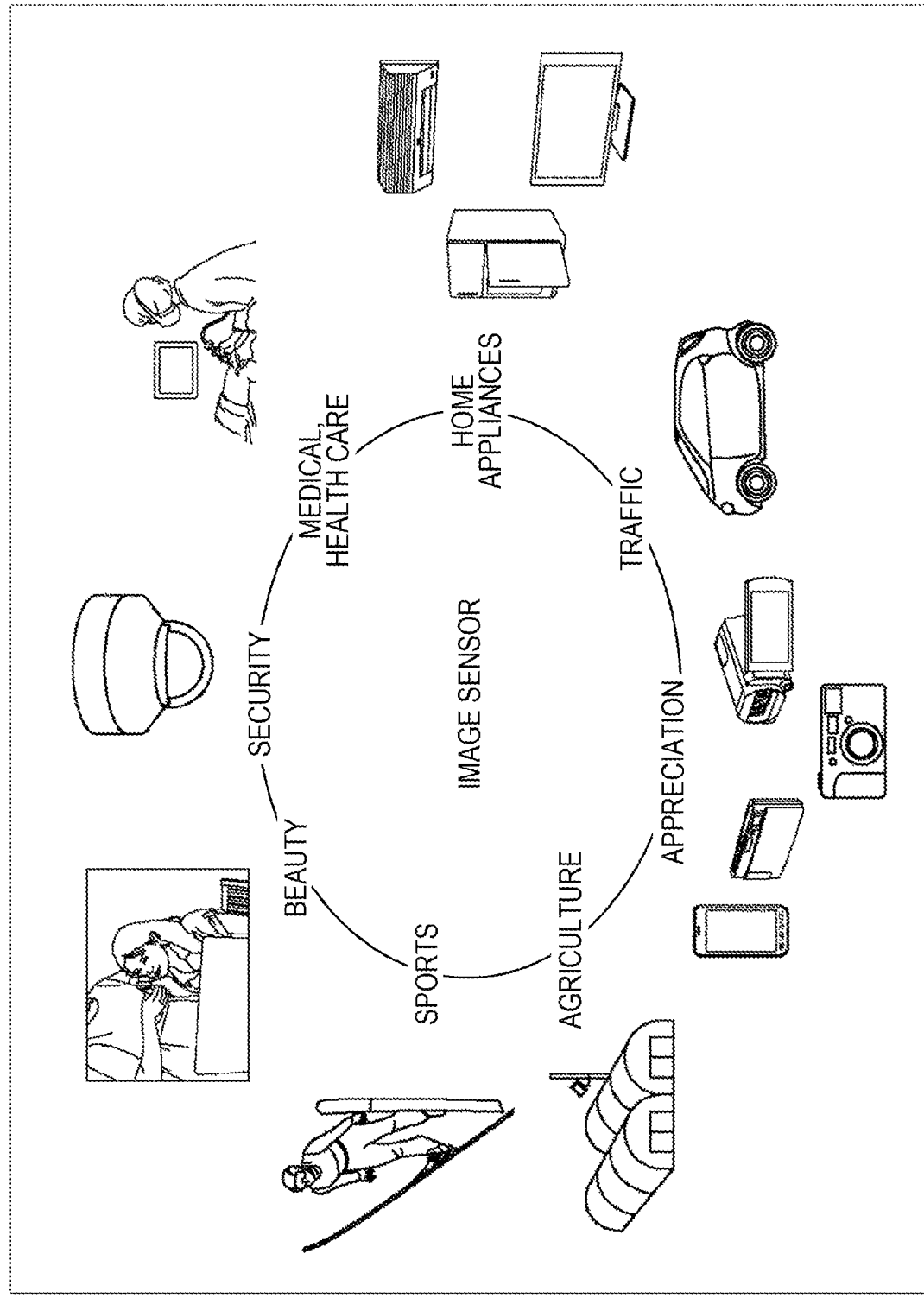
FIG. 13 is a diagram illustrating a use example of an image sensor to which the present technology is applied.

FIG. 13 is a diagram illustrating a use example using the above-described solid-state imaging element.

For example, the above-described solid-state imaging element (image sensor) can be used in various cases of sensing light such as visible light, infrared light, ultraviolet light, and X-rays as described below.

- Apparatuses such as a digital still camera and a portable device with a camera function which capture an image that is supplied for appreciation
- Apparatuses for traffic such as an in-vehicle sensor that captures images of a forward side, a backward side, the periphery, a vehicle interior, and the like of the vehicle for safe traveling such as automatic stopping, recognition of a driver state, and the like, a monitoring camera that monitors a traveling vehicle or a road, and a distance measuring sensor that measures a distance between vehicles, and the like
- Apparatuses for home appliances such as a TV, a refrigerator, and an air-conditioner to photograph a gesture of a user and to perform an apparatus operation in accordance with the gesture
- Apparatuses for medical or health care such as an endoscope and an apparatus that performs angiography through reception of infrared light
- Apparatuses for security such as a security monitoring camera and a personal authentication camera
- Apparatus for beauty such as a skin measuring device that photographs a skin and a microscope that photographs a scalp
- Apparatuses for sports such as an action camera and a wearable camera for sports or the like
- Apparatuses for agriculture such as a camera for monitoring a state of a farm and a crop plant

9. Example of Electronic Apparatus

Configuration Example of Electronic Apparatus

In addition, the present technology is not limited to application to the solid-state imaging element and is applicable to an imaging apparatus. Here, the imaging apparatus represents a camera system such as a digital still camera and a digital video camera, or an electronic apparatus such as a portable telephone having an imaging function. Furthermore, a module-shaped type that is mounted on the electronic apparatus, that is, a camera module may be set to the imaging apparatus.

Here, a configuration example of the electronic apparatus according to the present technology will be described with reference to FIG. 14.

Figure 14:
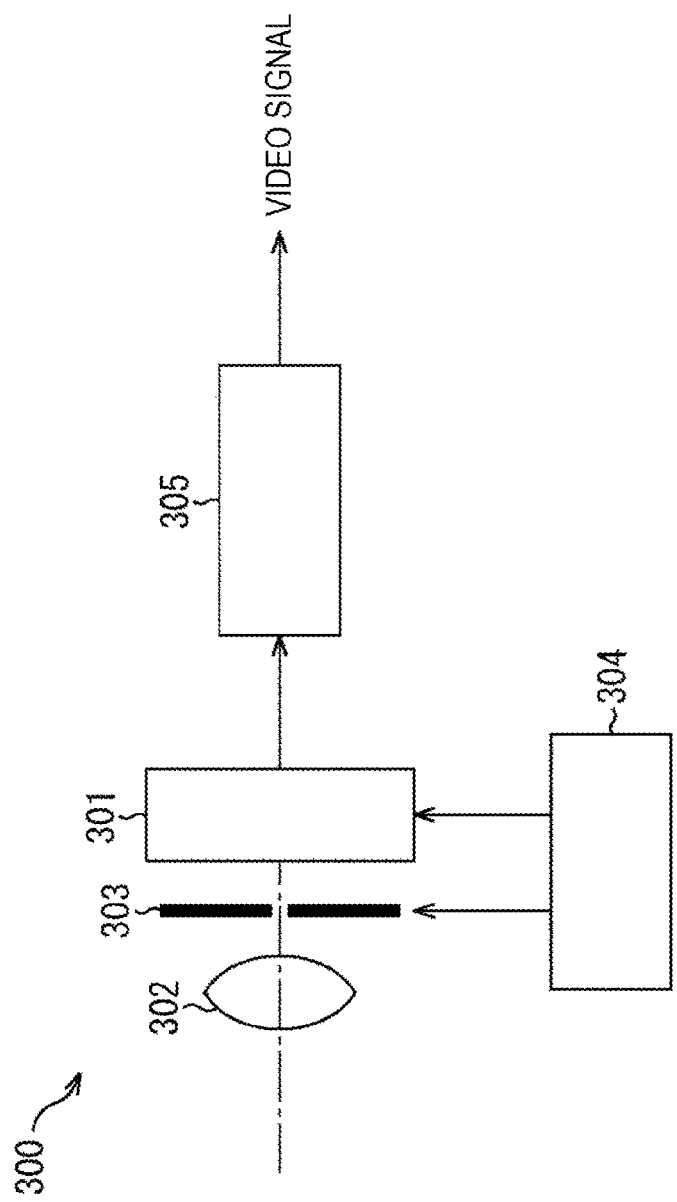
FIG. 14 is a block diagram illustrating a configuration example of an electronic apparatus to which the present technology is applied.

An electronic apparatus 300 illustrated in FIG. 14 includes a solid-state imaging element (element chip) 301, an optical lens 302, a shutter device 303, a drive circuit 304, and a signal processing circuit 305. As the solid-state imaging element 301, the solid-state imaging element 1 of the present technology as described above is provided.

The optical lens 302 forms an image of image light (incident light) from a subject on an imaging surface of the solid-state imaging element 301. With this arrangement, signal charges are accumulated in the solid-state imaging element 301 for a constant period. The shutter device 303 controls a light irradiation period and a light-shielding period with respect to the solid-state imaging element 301.

The drive circuit 304 supplies a drive signal for controlling a signal transfer operation of the solid-state imaging element 301, a shutter operation of the shutter device 303, and a light-emitting operation of a light-emitting unit (not illustrated). The drive circuit 304 controls respective operations by using parameters which are set by a CPU (not illustrated). The solid-state imaging element 301 performs signal transfer by the drive signal (timing signal) that is supplied from the drive circuit 304. The signal processing circuit 305 performs various kinds of signal processing with respect to a signal that is output from the solid-state imaging element 301. A video signal which is subjected to signal processing is stored in a storage medium such as a memory, and output to a monitor.

10. Application Example to Endoscopic Operating System

The technology (present technology) relating to the present disclosure can be applied to various products. For example, the technology relating to the present disclosure may be applied to an endoscopic operating system.

Figure 15:
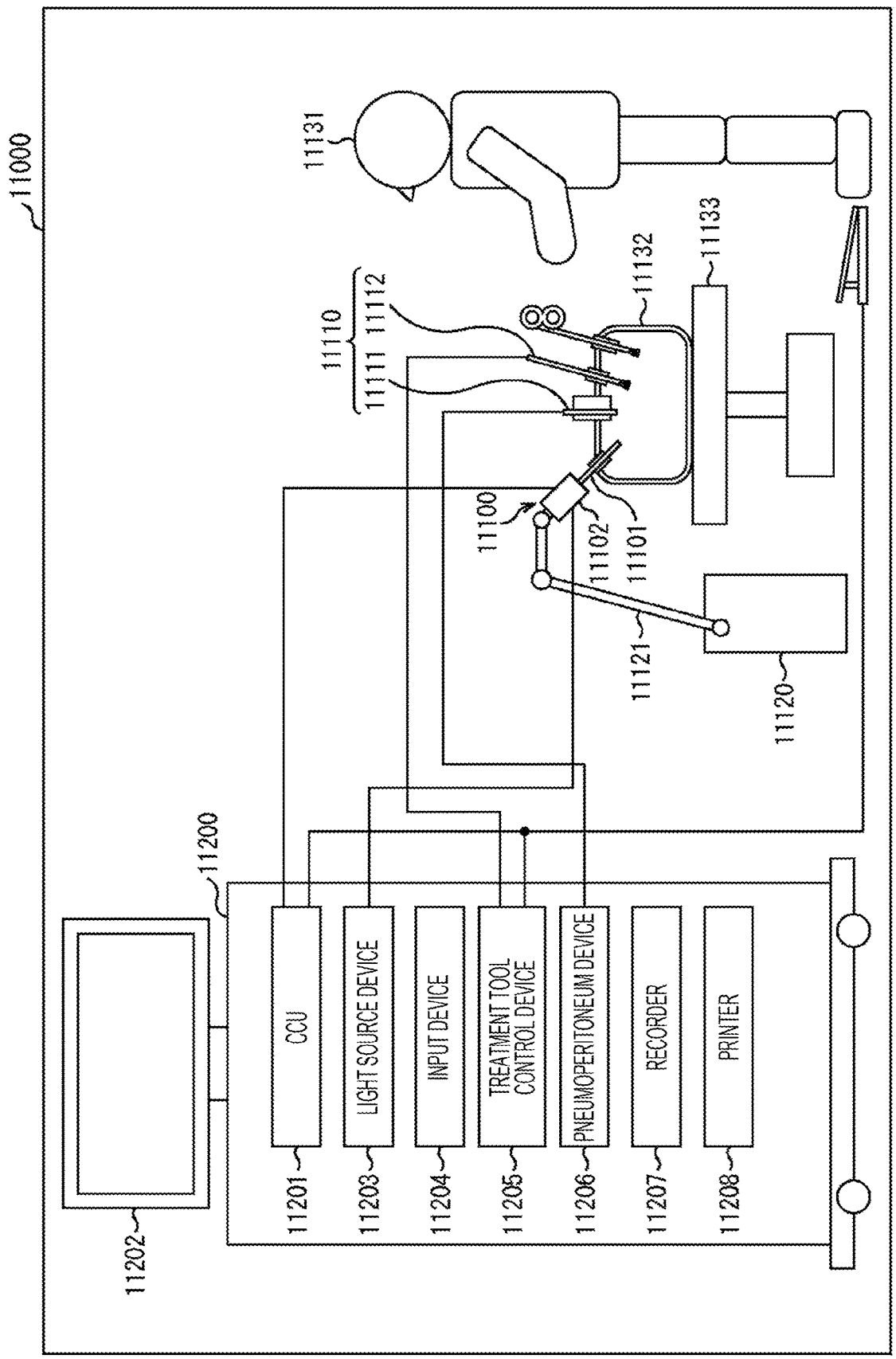
FIG. 15 is a diagram illustrating an example of a schematic configuration of an endoscopic operating system.

FIG. 15 is a diagram illustrating an example of a schematic configuration of the endoscopic operating system to which the technology (present technology) relating to the present disclosure is applicable.

FIG. 15 illustrates a state in which an operator (doctor) 11131 performs an operation with respect to a patient 11132 on a patient bed 11133 by using an endoscopic operating system 11000. As illustrated in the drawing, the endoscopic operating system 11000 includes an endoscope 11100, an operation tool 11110 such as a pneumoperitoneum tube 11111 and an energy treatment tool 11112, a support arm device 11120 that supports the endoscope 11100, and a cart 11200 on which various devices for an endoscopic operation are mounted.

The endoscope 11100 includes a lens-barrel 11101 of which a predetermined length of region from the tip end is inserted into a coelom of the patient 11132, and a camera head 11102 that is connected to a base end of the lens-barrel 11101. In the example illustrated in the drawing, the endoscope 11100 configured as a so-called hard mirror including the hard lens-barrel 11101 is illustrated in the drawing, but the endoscope 11100 may be configured as a so-called soft mirror including a soft lens-barrel.

An opening into which an objective lens is fitted is provided at a tip end of the lens-barrel 11101. A light source device 11203 is connected to the endoscope 11100, and light generated by the light source device 11203 is guided to the tip end of the lens-barrel by a light guide that is provided to extend into the lens-barrel 11101, and is emitted toward an observation target in the coelom of the patient 11132 through the objective lens. Furthermore, the endoscope 11100 may be a direct-viewing mirror, a perspective-viewing mirror, or a side-viewing mirror.

An optical system and an imaging element are provided in the camera head 11102, and reflected light (observation light) from the observation target is condensed to the imaging element by the optical system. When the observation light is photoelectrically converted by the imaging element, an electric signal corresponding to the observation light, that is, an image signal corresponding to an observation image is generated. The image signal is transmitted to a camera control unit (CCU) 11201 as RAW data.

The CCU 11201 is constituted by a central processing unit (CPU), a graphics processing unit (GPU), and the like, and collectively controls operations of the endoscope 11100 and a display device 11202. In addition, the CCU 11201 receives an image signal from the camera head 11102, and performs various kinds of image processing such as development processing (demosaic processing) for displaying an image based on the image signal with respect to the image signal.

The display device 11202 displays an image based on the image signal that is subjected to the image processing by the CCU 11201 in accordance with a control from the CCU 11201.

For example, the light source device 11203 includes a light source such as a light emitting diode (LED), and supplies irradiation light when photographing an operating site or the like to the endoscope 11100.

An input device 11204 is an input interface with respect to the endoscopic operating system 11000. A user can perform input or instruction input of various pieces of information with respect to the endoscopic operating system 11000 through the input device 11204. For example, the user inputs an instruction indicating changing of image capturing conditions (the kind of irradiation light, a magnification, a focal length, and the like) by the endoscope 11100, and the like.

A treatment tool control device 11205 controls drive of the energy treatment tool 11112 configured to perform cauterization of a tissue, incision, sealing of a blood vessel, and the like. A pneumoperitoneum device 11206 supplies a gas into the coelom through the pneumoperitoneum tube 11111 to swell the coelom of the patient 11132 so as to secure a visual field by the endoscope 11100 and a working space of the doctor. A recorder 11207 is a device that can record various pieces of information relating to an operation. A printer 11208 is a device that can print various pieces of information relating to the operation in various types such as a text, an image, and a graph.

Furthermore, for example, the light source device 11203, which supplies irradiation light when photographing an operating site with the endoscope 11100, can be constituted by an LED, a laser light source, and a white light source that is constituted by a combination of the LED and the laser light source. In a case where the white light source is constituted by a combination of RGB laser light sources, output intensity and an output timing of each color (each wavelength) can be controlled with high accuracy, and thus it is possible to perform adjustment of white balance of captured image in the light source device 11203. In addition, in this case, when laser light from the respective RGB laser light sources is emitted to an observation target in a time-division manner, and drive of the imaging element of the camera head 11102 is controlled in synchronization with the emission timing, it is also possible to capture images corresponding to RGB in a time-division manner. According to the method, even though color filters are not provided in the imaging element, it is possible to obtain a color image.

In addition, the drive of the light source device 11203 may be controlled so that the intensity of light that is emitted is changed for every predetermined time. When the drive of the imaging element of the camera head 11102 is controlled in synchronization with the light intensity changing timing to acquire images in a time-division manner, and the images are combined, it is possible to generate high dynamic range image without black defects and halation.

In addition, the light source device 11203 may be configured to supply light in a predetermined wavelength band corresponding special light observation. In the special light observation, for example, light in a band narrower than that of irradiation light (that is, white light) in a typical observation is emitted by using wavelength dependency of light absorption in a body tissue to perform a so-called narrow band light observation (narrow band imaging) which photographs a predetermined tissue such as a blood vessel in a mucous membrane surface layer at high contrast. In addition, in the special light observation, a fluorescent observation may be performed to obtain an image by fluorescence that occurs due to irradiation of excited light. In the fluorescent observation, for example, the body tissue may be irradiated with excited light to observe fluorescence from the body tissue (self-fluorescence observation), a reagent such as indocyanine green (ICG) may be locally injected into the body tissue and the body tissue may be irradiated with excited light corresponding to a fluorescent wavelength of the reagent to obtain a fluorescent image. The light source device 11203 may be configured to supply narrow band light and/or excited light corresponding to the special light observation.

FIG. 15 is a block diagram illustrating an example of a functional configuration of the camera head 11102 and the CCU 11201 which are illustrated in FIG. 14.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected to each other through a transmission cable 11400 in a communication-possible manner.

The lens unit 11401 is an optical system that is provided in a connection portion with the lens-barrel 11101. Observation light that is received from the tip end of the lens-barrel 11101 is guided to the camera head 11102, and is incident to the lens unit 11401. The lens unit 11401 is constituted in combination of a plurality of lenses including a zoom lens and a focus lens.

The imaging unit 11402 includes an imaging element. The number of the imaging element that constitutes the imaging unit 11402 may be one piece (a so-called single plate type) or a plurality of pieces (a so-called multi-plate type). In a case where the imaging unit 11402 is configured in the multi-plate type, for example, image signals corresponding to RGB may be generated by respective imaging elements, and may be combined with each other to obtain a color image. In addition, the imaging unit 11402 may include one piece of imaging element that acquires an image signal for a right eye and an image signal for a left eye which correspond to 3 dimensional (3D) display. When the 3D display is realized, the operator 11131 can understand a depth length of a biological tissue at an operating site with more accuracy. Furthermore, in a case where the imaging unit 11402 is configured as the multi-plate type, a plurality of the lens units 11401 may be provided in correspondence with respective imaging element.

In addition, it is not necessary for the imaging unit 11402 to be provided in the camera head 11102. For example, the imaging unit 11402 may be provided immediately after an objective lens at the inside of the lens-barrel 11101.

The drive unit 11403 includes an actuator and moves the zoom lens and the focus lens of the lens unit 11401 by a control from the camera head control unit 11405 by a predetermined length along an optical axis. With this arrangement, it is possible to appropriately adjust a magnification and a focus of an image captured by the imaging unit 11402.

The communication unit 11404 is constituted by a communication device that transmits and receives various pieces of information to and from the CCU 11201. The communication unit 11404 transmits the image signal obtained from the imaging unit 11402 to the CCU 11201 as RAW data through the transmission cable 11400.

In addition, the communication unit 11404 receives a control signal for controlling the drive of the camera head 11102 from the CCU 11201, and supplies the control signal to the camera head control unit 11405. For example, the control signal includes information relating to image capturing conditions such as information indicating designation of a frame rate of a captured image, information indicating designation of an exposure value during image capturing, and/or information regarding designation of a magnification and a focus of the captured image.

Furthermore, image capturing conditions such as the frame rate, the exposure value, the magnification, and the focus may be appropriately designated by a user, or may be automatically set by the control unit 11413 of the CCU 11201 on the basis of an image signal that is acquired. In the latter case, a so-called auto exposure (AE) function, an auto focus (AF) function, and an auto white balance (AWB) function are provided in the endoscope 11100.

The camera head control unit 11405 controls the drive of the camera head 11102 on the basis of the control signal from the CCU 11201 which is received through the communication unit 11404.

The communication unit 11411 is constituted by a communication device that transmits and receives various pieces information to and from the camera head 11102. The communication unit 11411 receives an image signal that is transmitted from the camera head 11102 through the transmission cable 11400.

In addition, the communication unit 11411 transmits a control signal for controlling the drive of the camera head 11102 to the camera head 11102. The image signal and the control signal can be transmitted through electric communication, optical communication, and the like.

The image processing unit 11412 performs various kinds of image processing with respect to the image signal that is PRAW data transmitted from the camera head 11102.

The control unit 11413 performs various controls relating to capturing an image of the operating site or the like by the endoscope 11100, and display of a captured image obtained by capturing the image of the operating site or the like. For example, the control unit 11413 generates a control signal for controlling the drive of the camera head 11102.

In addition, the control unit 11413 displays the captured image, on which the operating site and the like reflect, on the display device 11202 on the basis of the image signal that is subjected to the image processing by the image processing unit 11412. At this time, the control unit 11413 may recognize various objects in the captured image by using various image recognition technologies. For example, the control unit 11413 can recognize operation tools such as a forceps, a specific biological portion, bleeding, mist when using the energy treatment tool 11112, and the like by detecting an edge shape, a color, and the like of an object included in the captured image. When allowing the display device 11202 to display the captured image, the control unit 11413 may overlap various pieces of operation assisting information on the image of the operating site by using the recognition result. The operation assisting information is displayed in an overlapping manner and is provided to the operator 11131, it is possible to reduce load on the operator 11131, or the operator 11131 can reliably progress the operation.

The transmission cable 11400 that connects the camera head 11102 and the CCU 11201 is an electric signal cable corresponding to communication of an electric signal, optical fiber corresponding to optical communication, or a composite cable thereof.

Here, in the example illustrated in the drawing, communication is performed in a wired manner by using the transmission cable 11400, but communication between the camera head 11102 and the CCU 11201 may be performed in a wireless manner.

Hereinbefore, description has been given of an example of the endoscopic operating system to which the technology relating to the present disclosure is applicable. For example, the technology relating to the present disclosure is applicable to the endoscope 11100, the camera head 11102 (the imaging unit 11402 thereof), the image processing unit 11412 of the CCU 11201, the light source device 11203, and the like among the above-described configurations. Specifically, for example, the solid-state imaging element 1 in FIG. 1, FIG. 2, FIG. 4, FIG. 6, and FIG. 8 to FIG. 10 is applicable to the imaging unit 11402. When the technology relating to the present disclosure is applied to the imaging unit 11402 and the image processing unit 11412, almost all charges which are photoelectrically converted in the photodiode can be utilized for signals during high capacitance, and thus an operator can reliably confirm an operating site.

Furthermore, here, description has been given of the endoscopic operating system as an example, but the technology relating to the present disclosure may be applied to a microscopic operating system, and the like, for example.

11. Application Example to Moving Body

The technology (present technology) relating to the present disclosure can be applied to various products. For example, the technology relating to the present disclosure may be realized as a device that is mounted on any one kind of moving body among an automobile, an electric vehicle, a hybrid electric vehicle, a motorcycle, a bicycle, a personal mobility, an airplane, a drone, a ship, a robot, and the like.

Figure 16:
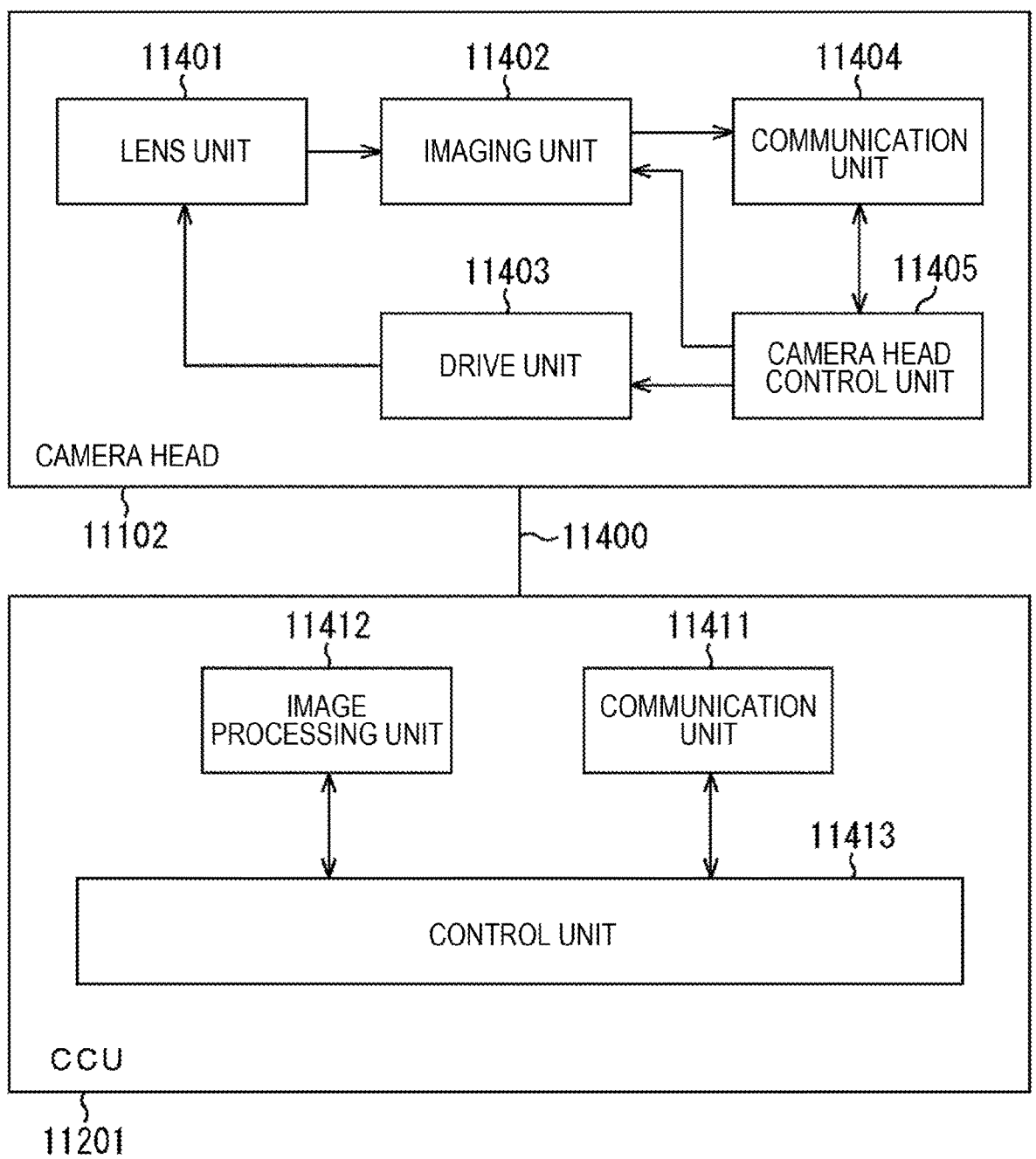
FIG. 16 is a block diagram illustrating an example of a functional configuration of a camera head and a CCU.

FIG. 16 is a block diagram illustrating a schematic configuration example of a vehicle control system that is an example of a moving body control system to which the technology relating to the present disclosure is applicable.

A vehicle control system 12000 includes a plurality of electronic control units which are connected to each other through a communication network 12001. In the example illustrated in FIG. 16, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network interface (I/F) 12053 are illustrated in the drawing.

The drive system control unit 12010 controls an operation of devices relating to a drive system of a vehicle in accordance with various programs. For example, the drive system control unit 12010 functions as a control device of a drive force generating device such as an internal combustion engine and a drive motor which generates a driving force of the vehicle, a drive force transmitting mechanism that transmits the drive force to wheels, a steering mechanism that adjusts a rudder angle of the vehicle, a brake device that generates a braking force of the vehicle, and the like.

The body system control unit 12020 controls an operation of various devices mounted on a vehicle body in accordance with various programs. For example, the body system control unit 12020 functions as a control device of various lamps such as a keyless entry system, a smart key system, a power window device, a head lamp, a back lamp, a brake lamp, a winker, and a fog lamp. In this case, an electric wave transmitted from a portable device that substitutes for a key, or signals of various switches can be input to the body system control unit 12020. The body system control unit 12020 receives input of the electric wave or the signals, and controls a door lock device, a power window device, and lamps, and the like of the vehicle.

The vehicle exterior information detection unit 12030 detects information of the outside of the vehicle on which the vehicle control system 12000 is mounted. For example, the imaging unit 12031 is connected to the vehicle exterior information detection unit 12030. The vehicle exterior information detection unit 12030 allows the imaging unit 12031 to capture a vehicle exterior image and receives the captured image. The vehicle exterior information detection unit 12030 may perform object detection processing with respect to a person, a vehicle, an obstacle, a mark, a character on a road surface, or the like, or distance detection processing on the basis of the image that is received.

The imaging unit 12031 is an optical sensor that receives light, and outputs an electric signal corresponding to a light reception amount of the light. The imaging unit 12031 can output the electric signal as an image, or as distance measurement information. In addition, light that is received by the imaging unit 12031 may be visible light, or non-visible light such as infrared rays.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that captures an image of a driver, and the vehicle interior information detection unit 12040 may calculate the degree of fatigue or the degree of concentration of the driver on the basis of detection information that is input from the driver state detection unit 12041, or may determine whether or not the driver dozes off.

The microcomputer 12051 can calculate a control target value of the drive force generating device, the steering mechanism, or the brake device on the basis of the vehicle interior information or the vehicle exterior information which are acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or shock mitigation of a vehicle, following travel based on a distance between vehicles, vehicle velocity retention travel, vehicle collision alarm, vehicle lane deviation alarm, and the like.

In addition, the microcomputer 12051 can perform a cooperative control for automatic driving in which the vehicle autonomously travels, and the like without depending on an operation by a driver by controlling the drive force generating device, the steering mechanism, the brake device, and the like on the basis of vehicle peripheral information that is acquired by the vehicle exterior information detection unit 12030 or the vehicle interior information detection unit 12040.

In addition, microcomputer 12051 can output a control command to the body system control unit 12030 on the basis of the vehicle exterior information that is acquired by the vehicle exterior information detection unit 12030. For example, the microcomputer 12051 can perform a cooperative control to realize glare protection by controlling a head lamp in correspondence with a position of a preceding vehicle or an oncoming vehicle which is detected by the vehicle exterior information detection unit 12030 to switch a high beam to a low beam, for example.

The voice and image output unit 12052 transmits an output signal of at least one of a voice or an image to an output device that can visually or auditorily notify a vehicle passenger or a vehicle exterior side of information. In the example of FIG. 16, as the output device, an audio speaker 12061, a display unit 12062, and an instrument panel 12063 are exemplified. For example, the display unit 12062 may include at least one of an on-board display or a head-up display.

Figure 17:
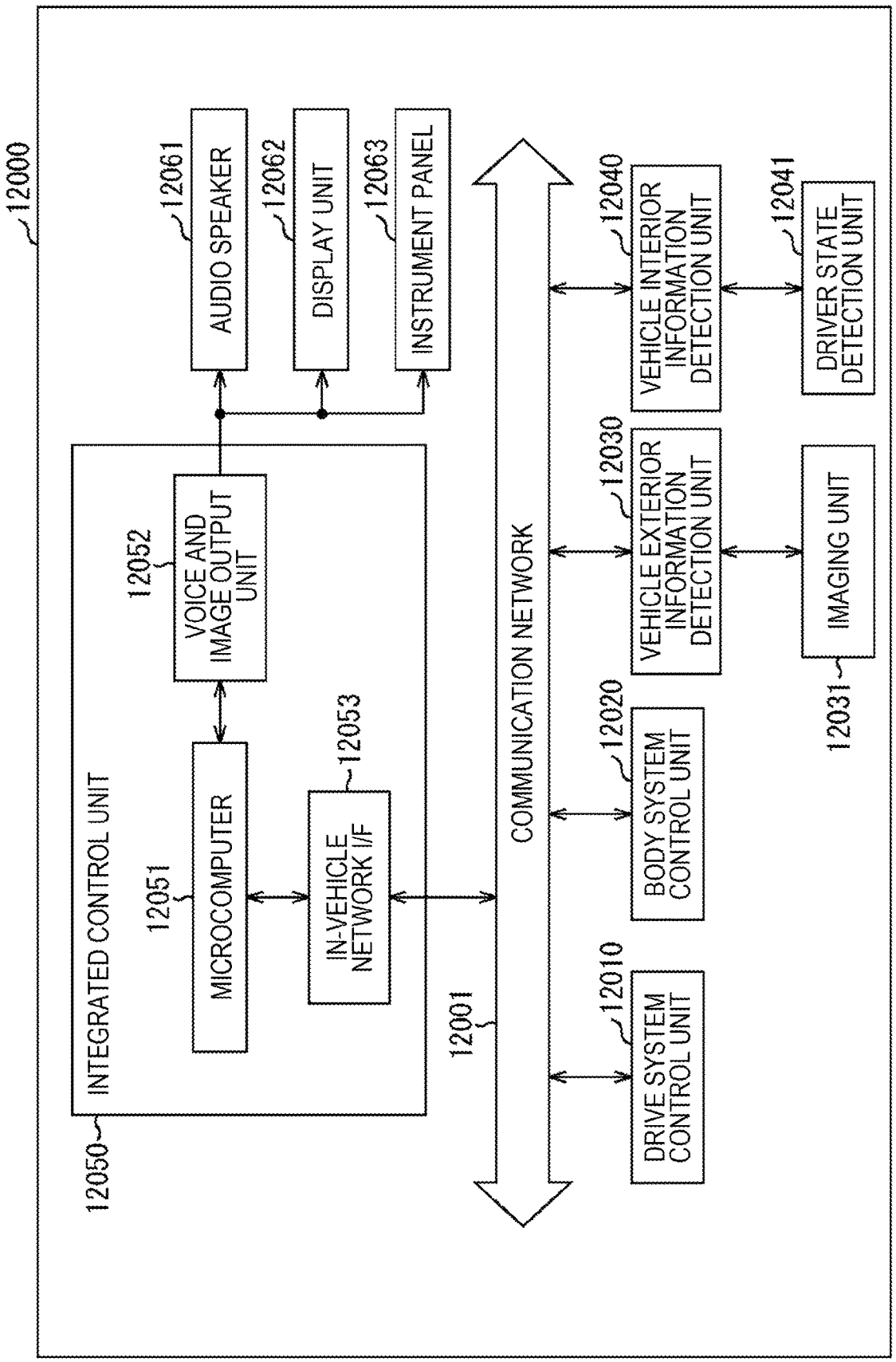
FIG. 17 is a block diagram illustrating an example of a schematic configuration of a vehicle control system.
Figure 18:
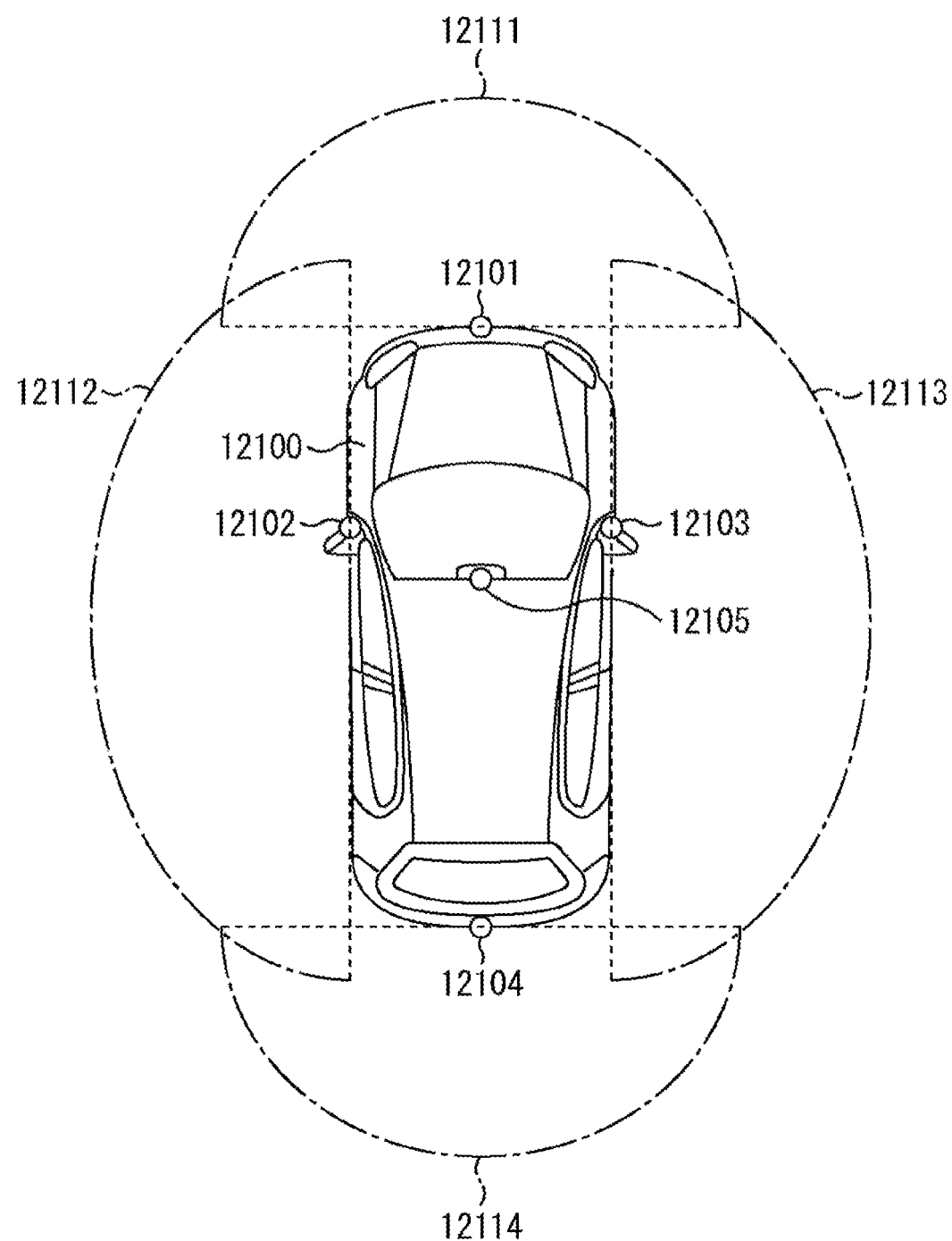
FIG. 18 is a view illustrating an example of an installation position of a vehicle exterior information detection unit and an imaging unit.

FIG. 17 is a view illustrating an example of an installation position of the imaging unit 12031.

In FIG. 17, as the imaging unit 12031, imaging units 12101, 12102, 12103, 12104, and 12105 are provided.

For example, in the vehicle 12100, the imaging units 12101, 12102, 12103, 12104, and 12105 are installed at positions such as a front nose, a side-view mirror, a rear bumper, a back door, and an upper side of a windshield in a vehicle room of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided at an upper portion of a windshield in a vehicle room is mainly used to detect a preceding vehicle, a pedestrian, an obstacle, a traffic signal, a traffic sign, a vehicle lane, and the like.

Furthermore, FIG. 17 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view mirrors, an image capturing range 12114 represents an image capturing range of the imaging unit 12104 that is provided in the rear bumper or the back door. For example, the imaging units 12101 to 12104 can superimpose a plurality of pieces of image data captured by the imaging unit 12101 to 12104 on each other, thereby obtaining an overlooking image when the vehicle 12100 is seen from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform cooperative control for automatic driving in which a vehicle autonomously travels without depending on an operation by a driver, and the like.

For example, the microcomputer 12051 can extract three-dimensional object data by classifying a plurality of pieces of the three-dimensional object data related to a three-dimensional object into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult to visually recognize by the driver. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the drive through the audio speaker 12061 or the display unit 12062, or by performing compulsory deceleration or avoidance steering through the drive system control unit 12010.

At least one of the imaging units 12101 to 12104 may bean infrared camera that detects infrared rays. For example, the microcomputer 12051 can recognize a pedestrian by determining whether or not the pedestrian exists during image capturing by the imaging units 12101 to 12104. For example, the pedestrian recognition is performed by a procedure of extracting a specific point in images captured by the imaging units 12101 to 12104 as an infrared camera, and a procedure of performing pattern matching processing for a series of specific points indicating a contour line of an object to determine whether or not the object is a pedestrian. The microcomputer 12051 determines that a pedestrian exists on the images captured by the imaging units 12101 to 12104, and recognizes the pedestrian, the voice and image output unit 12052 causes the display unit 12062 to overlap and display a quadrangular contour line for emphasis on the pedestrian who is recognized. In addition, the voice and image output unit 12052 may cause the display unit 12062 to display an icon indicating the pedestrian or the like at a desired position.

Hereinbefore, description has been given of an example of the vehicle control system to which the technology relating to the present disclosure is applicable. The technology relating to the present disclosure is applicable to the imaging unit 12031 (including the imaging units 12101 to 12104) among the above-described configurations. Specifically, for example, the solid-state imaging element 1 illustrated in FIG. 1, FIG. 2, FIG. 4, FIG. 6, and FIG. 8 to FIG. 10 is applicable to the imaging unit 12031. When the technology relating to the present disclosure is applied to the imaging unit 12031, almost all charges which are photoelectrically converted in the photodiode can be utilized for signals during high capacitance. Accordingly, for example, in an in-vehicle apparatus, it is possible to attain a particular effect capable of obtaining a clearer image.

Furthermore, in this specification, the steps of describing the above-described series of processing include processing that is executed in time series in accordance with a procedure that is described, and processing that is executed in parallel or individually even not being processed in time series.

In addition, embodiments in the present disclosure are not limited to the above-described embodiments, and various modifications can be made in a range not departing from the gist of the present disclosure.

In addition, in the above-described configurations, a configuration described as one device (or processing unit) may be divided into plural parts, and may be constituted by a plurality of devices (or processing units). In contrast, configurations described as a plurality of devices (or processing units) may be collectively constituted as one device (or processing unit). In addition, a configuration other than the above-described configurations may be added to the configurations of the respective devices (or respective processing units). In addition, configurations or operations with regard to the entirety of system are substantially the same in each case, a part of configurations of an arbitrary device (or processing unit) may be included in configurations of another device (or another processing unit). That is, the present technology is not limited to the above-described embodiments, and various modifications can be made within a range not departing from the gist of the present technology.

Hereinbefore, preferred embodiments of the present disclosure have been described in detail with reference to the accompanying drawings, but the disclosure is not limited to the examples. It is apparent that those skilled in the art of the present disclosure can conceive various modification examples or variation examples within a range of the technical sprit described in the appended claim, and thus it should be understood that the modification examples and the variation examples pertain to the technical range of the present disclosure.

Furthermore, the present technology can also employ the following configuration.

(1) A solid-state imaging element including:
a pixel region in which a plurality of pixels are arranged, in which each of the plurality of pixels includes,
a photoelectric conversion unit,
a transfer transistor,
a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units,
an amplification transistor that outputs a signal corresponding to a potential of each of the plurality of floating diffusion units, and
a selection transistor that is disposed on a drain side of the amplification transistor and selects a read-out row,
the selection transistor selects the read-out row after reset by the reset transistor, and
the transfer transistor performs reference potential read-out during high capacitance prior to reference potential read-out during low capacitance.

(2) The solid-state imaging element according to (1),
in which a power supply on a drain side of the reset transistor has a configuration capable of performing potential control of the plurality of floating diffusion units, and
the reset transistor resets the plurality of floating diffusion unit to a low potential after a read-out operation.

(3) An electronic apparatus including:
a solid-state imaging element that includes a pixel region in which a plurality of pixels are arranged,
each of the plurality of pixels includes,
a photoelectric conversion unit,
a transfer transistor, a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units,
an amplification transistor that outputs a signal corresponding to a potential of each of the plurality of floating diffusion units, and
a selection transistor that is disposed on a drain side of the amplification transistor and selects a read-out row,
the selection transistor selects the read-out row after reset by the reset transistor, and
the transfer transistor performs reference potential read-out during high capacitance prior to reference potential read-out during low capacitance;
a signal processing circuit that processes an output signal that is output from the solid-state imaging element; and
an optical system that causes incident light to be incident to the solid-state imaging element.

(4) A solid-state imaging element including:
a pixel region in which a plurality of pixels are arranged, in which each of the plurality of pixels includes,
a photoelectric conversion unit,
a transfer transistor,
a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units, and
an amplification transistor that outputs a signal corresponding to a potential of each of the plurality of floating diffusion units,
a power supply on a drain side of the reset transistor has a configuration capable of performing potential control of the plurality of floating diffusion units,
ON/OFF switching of the amplification transistor is performed by the potential control of the plurality of floating diffusion units,
the transfer transistor performs reference potential read-out during high capacitance prior to reference potential read-out during low capacitance, and
the reset transistor resets the plurality of floating diffusion unit to a low potential after a read-out operation.

(5) An electronic apparatus including:
a pixel region in which a plurality of pixels are arranged, each of the plurality of pixels includes,
a photoelectric conversion unit,
a transfer transistor,
a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units, and
an amplification transistor that outputs a signal corresponding to a potential of each of the plurality of floating diffusion units,
a power supply on a drain side of the reset transistor has a configuration capable of performing potential control of the plurality of floating diffusion units,
ON/OFF switching of the amplification transistor is performed by the potential control of the plurality of floating diffusion units,
the transfer transistor performs reference potential read-out during high capacitance prior to reference potential read-out during low capacitance, and
the reset transistor resets the plurality of floating diffusion unit to a low potential after a read-out operation;

a signal processing circuit that processes an output signal that is output from the solid-state imaging element; and
an optical system that causes incident light to be incident to the solid-state imaging element.

(6) A solid-state imaging element including:
a pixel region in which a plurality of pixels are arranged, in which each of the plurality of pixels includes,
a photoelectric conversion unit,
a transfer transistor,
a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units, and
an amplification transistor that outputs a signal corresponding to a potential of each of the plurality of floating diffusion units, and
before reference potential read-out during low capacitance,
a gate of the separation transistor is turned on in a state in which a drain side is in a floating state, and
the transfer transistor performs reference potential read-out during high capacitance.

(7) The solid-state imaging element according to (6),
in which after the reference potential read-out during high capacitance,
the gate of the separation transistor is turned off in a state in which the drain side is in a floating state, and
the transfer transistor performs reference potential read-out during low capacitance.

(8) The solid-state imaging element according to (7),
in which a negative bias of the separation transistor when being turned off is adjusted.

(9) The solid-state imaging element according to (7),
in which a threshold value of the separation transistor is adjusted.

(10) The solid-state imaging element according to (7),
in which a node that is parasitic in the plurality of floating diffusion unit is used, and a potential of the plurality of floating diffusion unit when the separation transistor is turned on is lowered.

(11) The solid-state imaging element according to any one of (6) to (10), further including:
a selection transistor that is disposed on a source side of the amplification transistor and selects a read-out row.

(12) The solid-state imaging element according to any one of (6) to (10), further including:
a selection transistor that is disposed on a drain side of the amplification transistor and selects a read-out row.

(13) The solid-state imaging element according to any one of (6) to (10),
in which a power supply on a drain side of the reset transistor has a configuration capable of performing potential control of the plurality of floating diffusion units, and
ON/OFF switching of the amplification transistor is performed by the potential control of the plurality of floating diffusion units.

(14) An electronic apparatus including:
a solid-state imaging element that includes a pixel region in which a plurality of pixels are arranged,
each of the plurality of pixels includes,
a photoelectric conversion unit,
a transfer transistor,
a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units, and
an amplification transistor that outputs a signal corresponding to a potential of each of the plurality of floating diffusion units, and
before reference potential read-out during low capacitance,
a gate of the separation transistor is turned on in a state in which a drain side is in a floating state, and
the transfer transistor performs reference potential read-out during high capacitance;
a signal processing circuit that processes an output signal that is output from the solid-state imaging element; and
an optical system that causes incident light to be incident to the solid-state imaging element.

REFERENCE SIGNS LIST

1 Solid-state imaging element
2 Pixel
3 Pixel region
9 Vertical signal line
50 Photodiode
51 Transfer transistor
52 Reset transistor
53 Amplification transistor
54 Selection transistor
55 Separation transistor
61 First floating diffusion unit
62 Second floating diffusion unit
63 Capacitive element
64 FD boost
71 Transfer line
72 Separation line
73 Selection line
74 Reset line
300 Electronic apparatus
301 Solid-state imaging element
302 Optical lens
303 Shutter device
304 Drive circuit
305 Signal processing circuit

What is claimed is:
1. A solid-state imaging element, comprising:
a pixel region in which a plurality of pixels are arranged, wherein each of the plurality of pixels includes:
a photoelectric conversion unit,
a transfer transistor,
a plurality of floating diffusion units that receive charges from the photoelectric conversion unit through the transfer transistor,
a reset transistor that resets the plurality of floating diffusion units,
a separation transistor that performs ON/OFF control of connection of the plurality of floating diffusion units, and
an amplification transistor that outputs a signal corresponding to a potential of each of the plurality of floating diffusion units,
wherein, before reference potential read-out during low capacitance, a gate of the separation transistor is turned on in a state in which a drain side is in a floating state, wherein the transfer transistor performs reference potential read-out during high capacitance,
wherein, after the reference potential read-out during high capacitance, the gate of the separation transistor is turned off in a state in which the drain side is in a floating state,
wherein the transfer transistor performs reference potential read-out during low capacitance, and
wherein a negative bias of the separation transistor when being turned off is adjusted.

2. A solid-state imaging element, comprising:
a pixel region in which a plurality of pixels are arranged,
wherein each of the plurality of pixels includes:
　a photoelectric conversion unit,
　a transfer transistor,
　a plurality of floating diffusion units that receive charges from the photoelectric conversion unit through the transfer transistor,
　a reset transistor that resets the plurality of floating diffusion units,
　a separation transistor that performs ON/OFF control of connection of the plurality of floating diffusion units, and
　an amplification transistor that outputs a signal corresponding to a potential of each of the plurality of floating diffusion units,
wherein, before reference potential read-out during low capacitance, a gate of the separation transistor is turned on in a state in which a drain side is in a floating state,
wherein the transfer transistor performs reference potential read-out during high capacitance,
wherein, after the reference potential read-out during high capacitance, the gate of the separation transistor is turned off in a state in which the drain side is in a floating state,
wherein the transfer transistor performs reference potential read-out during low capacitance, and
wherein a threshold value of the separation transistor is adjusted.

3. A solid-state imaging element, comprising:
a pixel region in which a plurality of pixels are arranged,
wherein each of the pixels in the plurality of pixels includes:
　a photoelectric conversion unit,
　a transfer transistor,
　a plurality of floating diffusion units that receive charges from the photoelectric conversion unit through the transfer transistor,
　a reset transistor that resets the plurality of floating diffusion units,
　a separation transistor that performs ON/OFF control of connection of the plurality of floating diffusion units, and
　an amplification transistor that outputs a signal corresponding to a potential of each of the plurality of floating diffusion units,
wherein, before reference potential read-out during low capacitance, a gate of the separation transistor is turned on in a state in which a drain side is in a floating state,
wherein the transfer transistor performs reference potential read-out during high capacitance,
wherein, after the reference potential read-out during high capacitance, the gate of the separation transistor is turned off in a state in which the drain side is in a floating state,
wherein the transfer transistor performs reference potential read-out during low capacitance, and
wherein a node that is parasitic in the plurality of floating diffusion units is used, and a potential of the plurality of floating diffusion units when the separation transistor is turned on is lowered.

4. The solid-state imaging element according to claim 1, further comprising:
　a selection transistor that is disposed on a source side of the amplification transistor and selects a read-out row.

5. The solid-state imaging element according to claim 1, further comprising:
　a selection transistor that is disposed on a drain side of the amplification transistor and selects a read-out row.

6. The solid-state imaging element according to claim 1,
wherein a power supply on a drain side of the reset transistor has a configuration capable of performing potential control of the plurality of floating diffusion units, and
ON/OFF switching of the amplification transistor is performed by the potential control of the plurality of floating diffusion units.

7. An electronic apparatus comprising:
a solid-state imaging element that includes a pixel region in which a plurality of pixels are arranged,
wherein each of the pixels in the plurality of pixels includes,
　a photoelectric conversion unit,
　a transfer transistor,
　a plurality of floating diffusion units which receive charges from the photoelectric conversion unit through the transfer transistor,
　a reset transistor that resets the plurality of floating diffusion units,
　a separation transistor that performs ON/OFF control of connection of the plurality of floating diffusion units, and
　an amplification transistor that outputs a signal corresponding to a potential of each of the plurality of floating diffusion units,
wherein, before reference potential read-out during low capacitance, a gate of the separation transistor is turned on in a state in which a drain side is in a floating state,
wherein the transfer transistor performs reference potential read-out during high capacitance;
wherein, after the reference potential read-out during high capacitance, the gate of the separation transistor is turned off in a state in which the drain side is in a floating state,
wherein the transfer transistor performs reference potential read-out during low capacitance, and
wherein a negative bias of the separation transistor when being turned off is adjusted;
a signal processing circuit that processes an output signal that is output from the solid-state imaging element; and
an optical system that causes incident light to be incident to the solid-state imaging element.

8. The electronic apparatus according to claim 7, wherein the solid state imaging element further includes:
　a selection transistor that is disposed on a source side of the amplification transistor and selects a read-out row.

9. The electronic apparatus according to claim 7, wherein the solid state imaging element further includes:
　a selection transistor that is disposed on a drain side of the amplification transistor and selects a read-out row.

10. The electronic apparatus according to claim 7,
wherein a power supply on a drain side of the reset transistor has a configuration capable of performing potential control of the plurality of floating diffusion units, and
ON/OFF switching of the amplification transistor is performed by the potential control of the plurality of floating diffusion units.

11. The solid-state imaging element according to claim 2, further comprising:
a selection transistor that is disposed on a source side of the amplification transistor and selects a read-out row.

12. The solid-state imaging element according to claim 2, further comprising:
a selection transistor that is disposed on a drain side of the amplification transistor and selects a read-out row.

13. The solid-state imaging element according to claim 2,
wherein a power supply on a drain side of the reset transistor has a configuration capable of performing potential control of the plurality of floating diffusion units, and
ON/OFF switching of the amplification transistor is performed by the potential control of the plurality of floating diffusion units.

14. The solid-state imaging element according to claim 3, further comprising:
a selection transistor that is disposed on a source side of the amplification transistor and selects a read-out row.

15. The solid-state imaging element according to claim 3, further comprising:
a selection transistor that is disposed on a drain side of the amplification transistor and selects a read-out row.

16. The solid-state imaging element according to claim 3,
wherein a power supply on a drain side of the reset transistor has a configuration capable of performing potential control of the plurality of floating diffusion units, and
ON/OFF switching of the amplification transistor is performed by the potential control of the plurality of floating diffusion units.

17. An electronic apparatus comprising:
a solid-state imaging element that includes a pixel region in which a plurality of pixels are arranged,
wherein each of the pixels in the plurality of pixels includes,
a photoelectric conversion unit,
a transfer transistor,
a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units, and
an amplification transistor that outputs a signal corresponding to a potential of each of the plurality of floating diffusion units,
wherein, before reference potential read-out during low capacitance, a gate of the separation transistor is turned on in a state in which a drain side is in a floating state,
wherein the transfer transistor performs reference potential read-out during high capacitance;
wherein, after the reference potential read-out during high capacitance, the gate of the separation transistor is turned off in a state in which the drain side is in a floating state,
wherein the transfer transistor performs reference potential read-out during low capacitance, and
wherein a threshold value of the separation transistor is adjusted;
a signal processing circuit that processes an output signal that is output from the solid-state imaging element; and
an optical system that causes incident light to be incident to the solid-state imaging element.

18. The electronic apparatus according to claim 17, wherein the solid state imaging element further includes:
a selection transistor that is disposed on a source side of the amplification transistor and selects a read-out row.

19. The electronic apparatus according to claim 17, wherein the solid state imaging element further includes:
a selection transistor that is disposed on a drain side of the amplification transistor and selects a read-out row.

20. An electronic apparatus comprising:
a solid-state imaging element that includes a pixel region in which a plurality of pixels are arranged,
wherein each of the pixels in the plurality of pixels includes,
a photoelectric conversion unit,
a transfer transistor,
a plurality of floating diffusion units which receive charges from the photoelectric conversion unit through the transfer transistor,
a reset transistor that resets the plurality of floating diffusion units,
a separation transistor that performs ON/OFF control of connection of the plurality of floating diffusion units, and
an amplification transistor that outputs a signal corresponding to a potential of each of the plurality of floating diffusion units,
wherein, before reference potential read-out during low capacitance, a gate of the separation transistor is turned on in a state in which a drain side is in a floating state,
wherein the transfer transistor performs reference potential read-out during high capacitance;
wherein, after the reference potential read-out during high capacitance, the gate of the separation transistor is turned off in a state in which the drain side is in a floating state,
wherein the transfer transistor performs reference potential read-out during low capacitance, and
wherein a node that is parasitic in the plurality of floating diffusion units is used, and a potential of the plurality of floating diffusion units when the separation transistor is turned on is lowered;
a signal processing circuit that processes an output signal that is output from the solid-state imaging element; and
an optical system that causes incident light to be incident to the solid-state imaging element.

* * * * *